(12) United States Patent
Matsuda

(10) Patent No.: US 10,297,716 B2
(45) Date of Patent: May 21, 2019

(54) LIGHT EMITTING DEVICE AND LIGHT EMITTING MODULE

(71) Applicant: LG INNOTEK CO., LTD., Seoul (KR)

(72) Inventor: Shuhei Matsuda, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 13 days.

(21) Appl. No.: 15/740,410

(22) PCT Filed: Jul. 1, 2016

(86) PCT No.: PCT/KR2016/007112
§ 371 (c)(1),
(2) Date: Dec. 28, 2017

(87) PCT Pub. No.: WO2017/007182
PCT Pub. Date: Jan. 12, 2017

(65) Prior Publication Data
US 2018/0190869 A1   Jul. 5, 2018

(30) Foreign Application Priority Data
Jul. 3, 2015   (KR) .................. 10-2015-0095456

(51) Int. Cl.
*H01L 33/36*   (2010.01)
*H01L 33/60*   (2010.01)
(Continued)

(52) U.S. Cl.
CPC .............. *H01L 33/36* (2013.01); *H01L 24/42* (2013.01); *H01L 33/60* (2013.01); *H01L 33/64* (2013.01);
(Continued)

(58) Field of Classification Search
CPC ......... H01L 33/62; H01L 33/36; H01L 33/38; H01L 33/486
See application file for complete search history.

(56) References Cited

U.S. PATENT DOCUMENTS

| | | | | |
|---|---|---|---|---|
| 2008/0296592 | A1* | 12/2008 | Osamu .................. | H01L 33/486 257/89 |
| 2012/0161191 | A1* | 6/2012 | Cheng ................... | H01L 33/486 257/99 |
| 2014/0319564 | A1* | 10/2014 | Lin ........................ | H01L 24/14 257/98 |

FOREIGN PATENT DOCUMENTS

| | | |
|---|---|---|
| JP | 2000-124506 | 4/2000 |
| JP | 2007-273852 | 10/2007 |

(Continued)

OTHER PUBLICATIONS

International Search Report (with English Translation) and Written Opinion dated Nov. 7, 2016 issued in Application No. PCT/KR2016/007112.

*Primary Examiner* — Ermias T Woldegeorgis
(74) *Attorney, Agent, or Firm* — Ked & Associates, LLP

(57) ABSTRACT

A light emitting device disclosed in an embodiment includes: a light emitting chip including a plurality of semiconductor layers and first and second electrodes under the plurality of semiconductor layers; a first lead frame disposed under a first electrode of the light emitting chip; a second lead frame disposed under a second electrode of the light emitting chip; a protective chip disposed between the first and second lead frames and electrically connected to the first and second electrodes; and a reflective member disposed on a periphery of the light emitting chip and the first and second lead frames.

20 Claims, 18 Drawing Sheets

(51) Int. Cl.
  *H01L 33/64* (2010.01)
  *H01L 23/00* (2006.01)
  *H01L 33/62* (2010.01)
  *H01L 25/16* (2006.01)

(52) U.S. Cl.
  CPC ............ *H01L 33/647* (2013.01); *H01L 24/16* (2013.01); *H01L 24/48* (2013.01); *H01L 25/167* (2013.01); *H01L 33/62* (2013.01); *H01L 2224/16245* (2013.01); *H01L 2224/48091* (2013.01); *H01L 2224/48106* (2013.01); *H01L 2224/48108* (2013.01); *H01L 2224/48145* (2013.01); *H01L 2224/48227* (2013.01); *H01L 2224/48247* (2013.01); *H01L 2224/83411* (2013.01); *H01L 2224/83439* (2013.01); *H01L 2224/83444* (2013.01); *H01L 2224/83447* (2013.01); *H01L 2224/83455* (2013.01); *H01L 2224/83464* (2013.01); *H01L 2224/83466* (2013.01); *H01L 2224/83469* (2013.01); *H01L 2224/83471* (2013.01); *H01L 2224/83481* (2013.01); *H01L 2224/85411* (2013.01); *H01L 2224/85439* (2013.01); *H01L 2224/85444* (2013.01); *H01L 2224/85447* (2013.01); *H01L 2224/85455* (2013.01); *H01L 2224/85464* (2013.01); *H01L 2224/85466* (2013.01); *H01L 2224/85469* (2013.01); *H01L 2224/85471* (2013.01); *H01L 2224/85481* (2013.01); *H01L 2924/00014* (2013.01); *H01L 2924/12041* (2013.01)

(56) References Cited

FOREIGN PATENT DOCUMENTS

| | | | | |
|---|---|---|---|---|
| JP | 2015-043374 | | 3/2015 | |
| JP | 2015043374 A | * | 3/2015 | |
| KR | 10-2013-0032202 | | 4/2013 | |
| KR | 20130032202 A | * | 4/2013 | ............ H01L 24/97 |
| KR | 10-2015-0042012 | | 4/2015 | |

* cited by examiner

LIGHT EMITTING DEVICE AND LIGHT EMITTING MODULE

CROSS-REFERENCE TO RELATED PATENT APPLICATIONS

This application is a U.S. National Stage Application under 35 U.S.C. § 371 of PCT Application No. PCT/KR2016/007112, filed Jul. 1, 2016, which claims priority to Korean Patent Application No. 10-2015-0095456, filed Jul. 3, 2015, whose entire disclosures are hereby incorporated by reference.

TECHNICAL FIELD

Embodiments relate to a light emitting device and a light emitting module including the same.

BACKGROUND ART

Light emitting devices, for example, light emitting diodes, are a type of semiconductor device which converts electrical energy into light, and are attracting much attention as a next-generation light source by replacing conventional fluorescent lamps and incandescent lamps.

Since the light emitting diodes generate light by using a semiconductor device, the light emitting diodes consume only a very low power in comparison with incandescent lamps, which heat tungsten to generate light, or fluorescent lamps which cause a phosphor to collide with ultraviolet generated through high pressure discharge to generate light.

The light emitting diodes are used as a light source for lighting devices such as various lamps, liquid crystal displays, electronic display boards, street lamps, and indicating lamps used at indoor and outdoor places, and the use of the light emitting diodes as the light source is increasing.

DISCLOSURE

Technical Problem

Embodiments provide a light emitting device having a new heat dissipation structure.

Embodiments provide a light emitting device in which a protective chip is disposed between a light emitting chip and a plurality of lead frames.

Embodiments provide a light emitting device and a light emitting module including the same, in which a protective chip is directly connected to a portion under a light emitting chip.

Technical Solution

A light emitting device according to an embodiment includes: a light emitting chip including a plurality of semiconductor layers and first and second electrodes under the plurality of semiconductor layers; a first lead frame disposed under a first electrode of the light emitting chip; a second lead frame disposed under a second electrode of the light emitting chip; a protective chip disposed between the first and second lead frames and electrically connected to the first and second electrodes; and a reflective member disposed on a periphery of the light emitting chip and the first and second lead frames.

A light emitting device includes: a light emitting chip including a substrate, a plurality of semiconductor layers under the substrate, and first and second electrodes under the plurality of semiconductor layers; a first lead frame disposed under a first electrode of the light emitting chip; a second lead frame disposed under a second electrode of the light emitting chip; a protective chip disposed between the first and second lead frames and electrically connected to the first and second electrodes; and a reflective member disposed on a periphery of the light emitting chip and the first and second lead frames, wherein an interval between the first and second lead frames is provided wider than an interval between the first and second electrodes, a thickness of the first and second lead frames is provided thicker than a thickness of the protective chip, and the reflective member comprises a resin material and is disposed in a region between the first and second lead frames and a region between the first and second electrodes.

A light emitting module includes: the light emitting device; a circuit board including first and second electrode pads under the light emitting device; and a bonding member disposed between the circuit board and the light emitting device, wherein the first and second lead frames of the light emitting device are connected to the first and second electrode pads of the circuit board by the bonding member.

Advantageous Effect

Embodiments provide a light emitting device which includes a protective chip under a flip type light emitting chip.

Embodiments can reduce a width and a thickness of a light emitting device.

Embodiments can prevent an emission efficiency of a light emitting device from being reduced.

Embodiments can provide a light emitting device with improved heat dissipation efficiency.

Embodiments can improved the reliability of a light emitting device and a light emitting module including the same.

MODE FOR INVENTION

Figure 1:
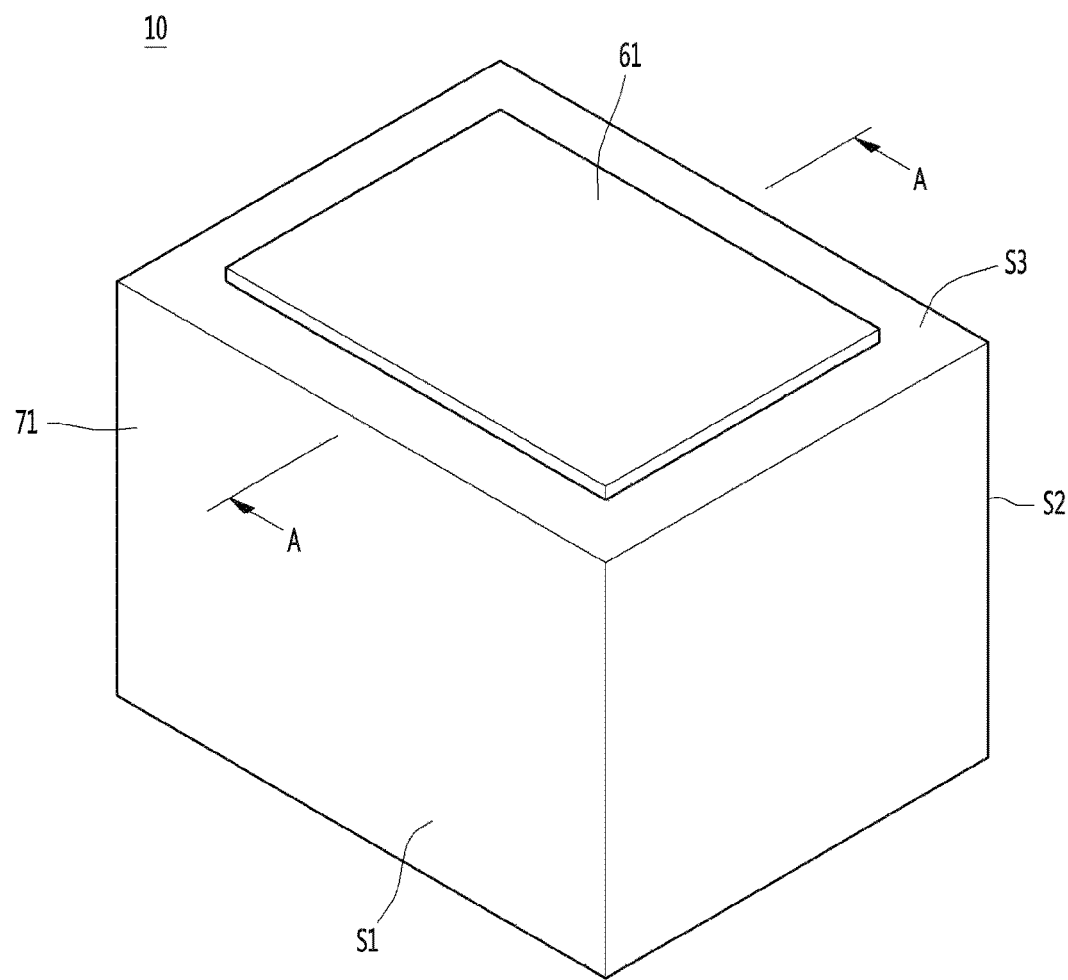
FIG. 1 is a perspective view illustrating a light emitting device according to a first embodiment.

Hereinafter, embodiments will be clearly disclosed through descriptions of the embodiments and the accompanying drawings. In the description of embodiments, it will be understood that when a layer (or film), region, pattern or structure is referred to as being 'on' another layer (or film), region, pad or pattern, the terminology of 'on' and 'under' includes both the meanings of 'directly' and 'indirectly'. Furthermore, the reference about 'on' and 'under' each layer will be made on the basis of drawings.

Hereinafter, a light emitting device according to embodiments will be described with reference to the accompanying drawings. Like or corresponding reference numerals refer to like elements throughout, and repetitive descriptions are omitted.

Figure 2:
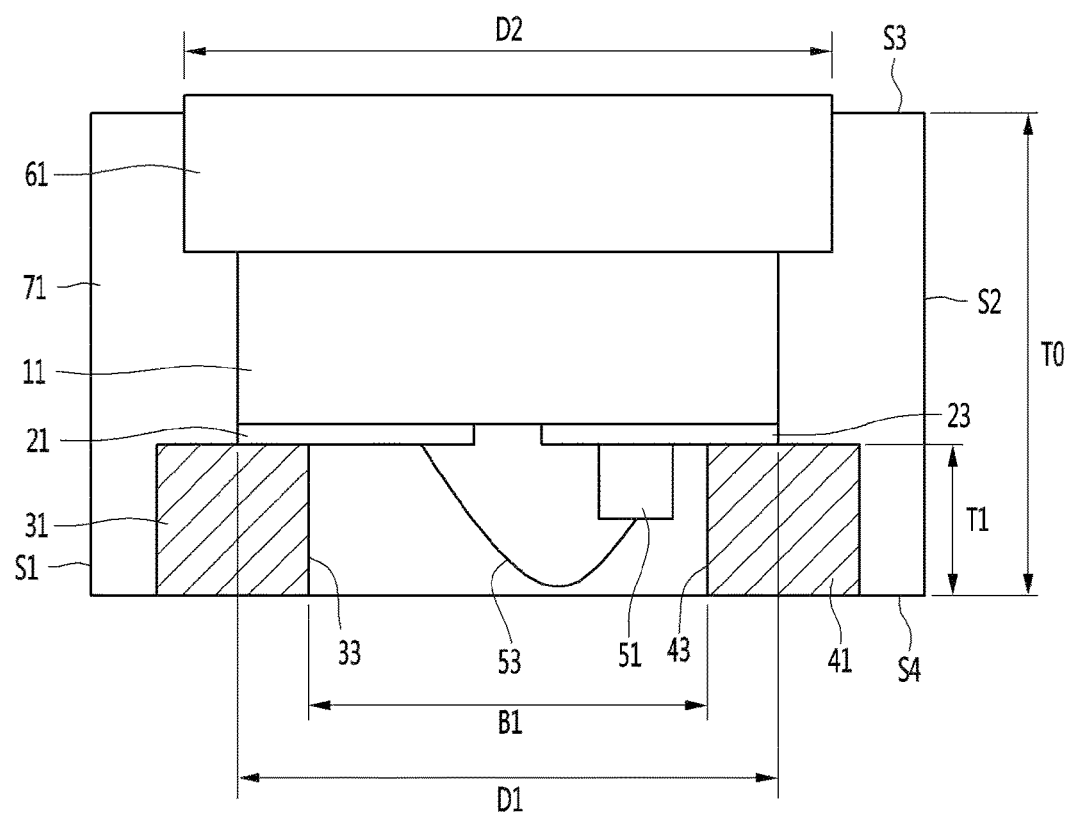
FIG. 2 is a cross-section view taken along line A-A of the light emitting device of FIG. 1.
Figure 3:
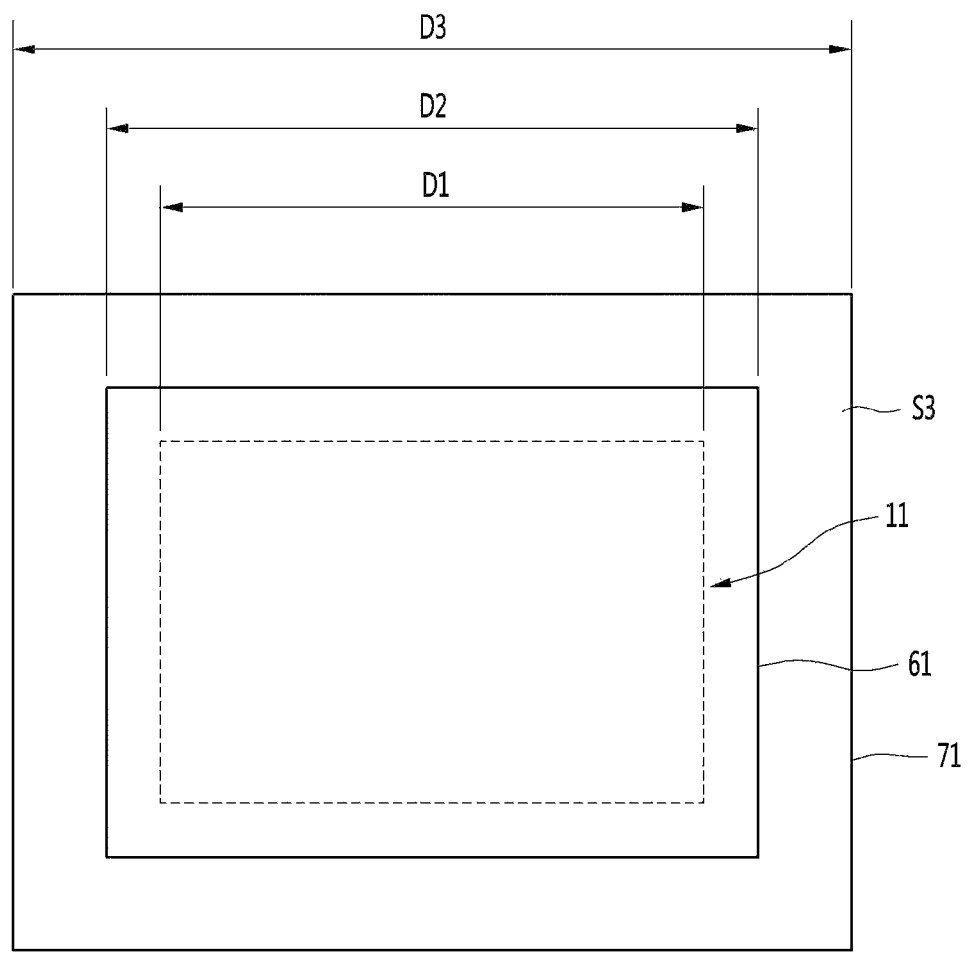
FIG. 3 is a plan view of the light emitting device of FIG. 1.
Figure 4:
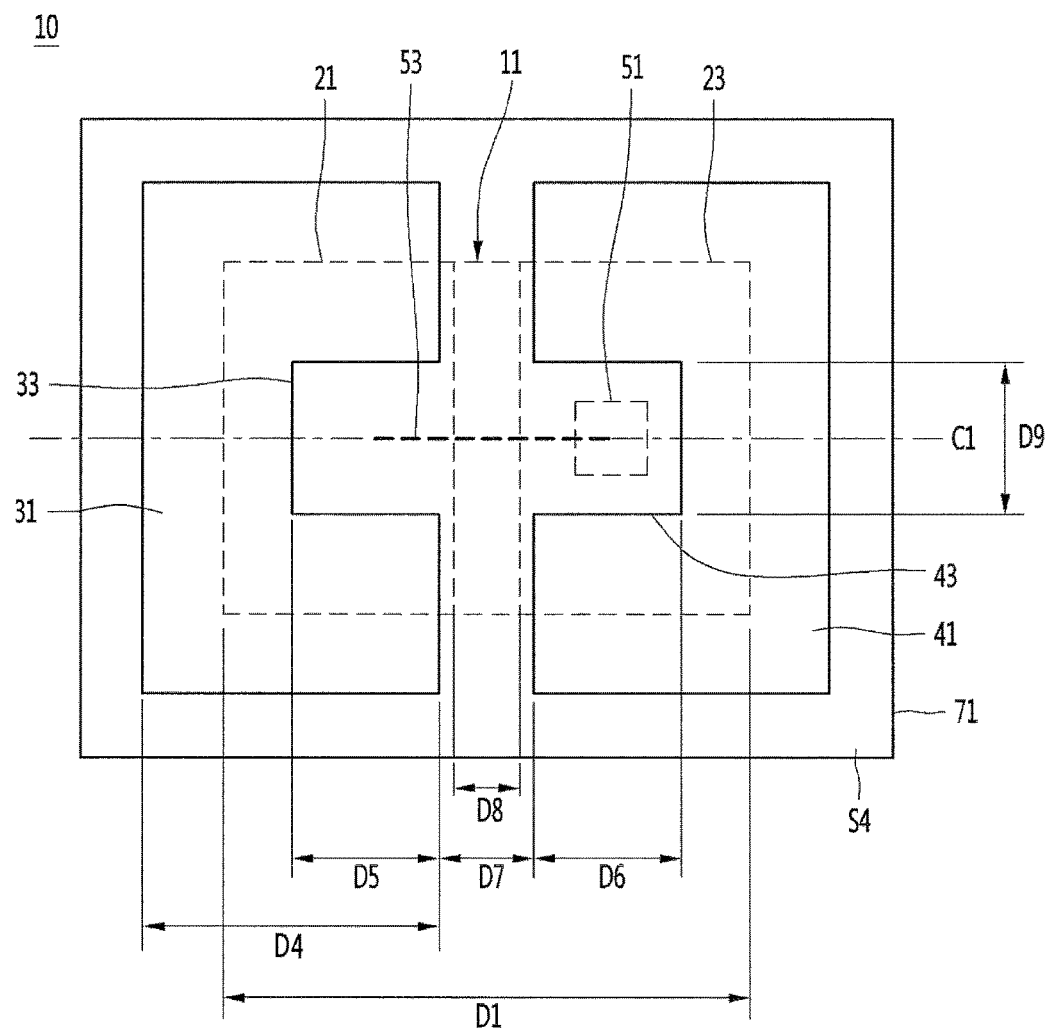
FIG. 4 is a bottom view illustrating a protective chip in the light emitting device of FIG. 1.

FIG. 1 is a perspective view illustrating a light emitting device according to a first embodiment, FIG. 2 is a cross-section view taken along line A-A of the light emitting device of FIG. 1, FIG. 3 is a plan view of the light emitting device of FIG. 1, and FIG. 4 is a bottom view illustrating a protective chip in the light emitting device of FIG. 1.

Referring to FIGS. 1 to 4, a light emitting device 10 includes a light emitting chip 11, a plurality of lead frames 31 and 41 disposed under different regions of the light emitting chip 11, a protective chip 51 connected to the light emitting chip 11 and disposed between the plurality of lead frames 31 and 41, and a reflective member 71 disposed on a periphery of each of the light emitting chip 11 and the plurality of lead frames 31 and 41.

The light emitting device 10 may emit at least one of blue light, green light, red light, and white light. The light emitting device 10 can prevent a side leakage of light emitted from the light emitting chip 11 and may output the light through a top surface.

The light emitting chip 11 may selectively emit light within a range from a visible light band to an ultraviolet band. The light emitting chip 11 may include at least one of, for example, an ultraviolet (UV) light emitting diode (LED), a red LED, a blue LED, a green LED, a yellow green LED, an infrared LED, and a white LED.

The light emitting chip 11 may include at least one of a horizontal chip structure, where two electrodes in a chip are disposed adjacent to each other, and a vertical chip structure where two electrodes are disposed opposite to each other, but is not limited thereto. The light emitting chip 11 according to an embodiment may be disposed on the plurality of lead frames 31 and 34 in a flip chip type. In the flip chip type light emitting chip 11, two electrodes 21 and 23 may be disposed in parallel in a lower portion, but are not limited thereto.

The light emitting chip 11 may include a light emitting structure including a plurality of semiconductor layers, for example, a first conductive semiconductor layer, an active layer, and a second conductive semiconductor layer. The light emitting chip 11 may include a transmissive substrate on the light emitting structure. The light emitting structure may be electrically connected to the electrodes 21 and 23. The first and second electrodes 21 and 23 may be disposed under the light emitting structure. A top surface of the light emitting chip 11 may include a concave-convex structure for light extraction, and the concave-convex structure may change a threshold angle of emitted light. Also, the concave-convex structure can improve a contact area contacting with a phosphor layer 61 and improve light extraction efficiency. The concave-convex structure may be provided on the transmissive substrate.

The light emitting chip 11 may include a plurality of electrodes (for example, a first electrode 21 and a second electrode 23) in a lower portion, and the first electrode 21 and the second electrode 23 may be disposed in the lower portion of the light emitting chip 11 and may be separated from each other. The first electrode 21 and the second electrode 23 may be formed of at least one of gold (Au), nickel (Ni), chromium (Cr), tantalum (Ta), platinum (Pt), tin (Sn), silver (Ag), phosphorus (P), titanium (Ti), palladium (Pd), and copper (Cu), or a selective alloy thereof, and may be formed of a single layer or a multilayer. At least one of the first electrode 21 and the second electrode 23 may include an arm pattern, and the arm pattern may diffuse a current.

A protective chip 51 may be disposed under at least one of the first electrode 21 and the second electrode 23. The protective chip 51 may be electrically connected to the first and second electrodes 21 and 23. The protective chip 51, for example, may be disposed under the second electrode 23 and may be connected to the first electrode by a wire 53. As another example, the protective chip 51 may be disposed under the first electrode 21 and may be connected to the second electrode 23 by the wire 53.

The protective chip 51 may be implemented with a thyristor, a Zener diode, or a transient voltage suppression (TVS) device. The protective chip 51 may be connected to the light emitting chip 11 in parallel or in inversely parallel. The protective chip 51 may be a unidirectional diode or a bidirectional diode. The protective chip 51 protects the light emitting chip 11 from electro static discharge (ESD).

A length of one side of the protective chip 51 may be shorter than that of one side of the light emitting chip 11. A thickness of the protective chip 51 may be thinner than that of the light emitting chip 11 and that of the lead frames 31 and 41.

The light emitting device 10 may include the phosphor layer 61. The phosphor layer 61 may be disposed on a top surface of the light emitting chip 11. The phosphor layer 61 may disposed on the top surface of the light emitting chip 11 in contact with or apart from the top surface. The phosphor layer 61 may disposed on the top surface and a side surface of the light emitting chip 11 in contact with or apart from the top surface and the side surface.

As in FIGS. 2 and 3, a width D2 or an area of a top surface of the phosphor layer 61 may be equal to or wider than a width D1 or an area of the top surface of the light emitting chip 11. The phosphor layer 61 may be disposed to have a size for covering the whole top surface of the light emitting chip 11, and thus, a wavelength conversion efficiency of light emitted from the light emitting chip 11 can be improved. The top surface of the phosphor layer 61 may protrude further than a top surface of the reflective number. Therefore, light extraction efficiency based on the top surface and a side upper portion of the phosphor layer 61.

The phosphor layer 61 wavelength-converts some lights emitted from the light emitting chip 11. The phosphor layer 61 may include a phosphor in silicon or epoxy resin, and the phosphor may include at least one of a red phosphor, a green phosphor, a blue phosphor, and a yellow phosphor. However, the present embodiment is not limited thereto. The phosphor may be formed of, for example, a material selected from among YAG, TAG, silicate, nitride, and an oxy-nitride-based material.

As in FIG. 3, the width D2 of the phosphor layer 61 may be longer than a width D1 of one side of the light emitting chip 11 and may be narrower than a width D3 of the reflective member 71. The width D3 of the reflective member 71 may be a width of the light emitting device. A top surface of the phosphor layer 61 may include at least one of a convex surface, a concave surface, a planar surface, or a rough surface.

The plurality of lead frames 31 and 41 may include two or more lead frames, and for convenience of description, two lead frames will be described. The plurality of lead frames 31 and 41 include a first lead frame 31 disposed under the first electrode 21 and a second lead frame 41 disposed under the second electrode 23. As in FIG. 4, an interval D7 between the first and second lead frames 31 and 41 is disposed greater than an interval D8 between the first and second electrodes 21 and 23, thereby preventing heat from concentrating on a gap region between the first and second lead frames 31 and 41.

The first and second lead frames 31 and 41 may be formed of at least one of gold (Au), nickel (Ni), chromium (Cr), tantalum (Ta), platinum (Pt), tin (Sn), silver (Ag), phosphorus (P), titanium (Ti), palladium (Pd), and copper (Cu), or a selective alloy thereof, and may be formed of a single layer or a multilayer. The first and second lead frames 31 and 41 may include, for example, copper or a copper alloy.

The first lead frame 31 may be disposed under the first electrode 21. The first lead frame 31 may be bonded to a portion under the first electrode 21. As in FIG. 4, the first lead frame 31 may protrude more outward than an outer surface of the light emitting chip 11. The first lead frame 31 may protrude more outward than at least three of outer surfaces of the light emitting chip 11. An area of a top surface or a bottom surface of the first lead frame 31 is set to be greater than a bottom area of the first electrode 21, thereby improving heat dissipation efficiency.

The second lead frame 41 may be disposed under the second electrode 23. The second lead frame 41 may be bonded to a portion under the second electrode 23. As in FIG. 4, the second lead frame 41 may protrude more outward than the outer surface of the light emitting chip 11. The second lead frame 41 may protrude more outward than at least three of the outer surfaces of the light emitting chip 11. An area of a top surface or a bottom surface of the second lead frame 41 is set to be greater than an area of a bottom surface of the second electrode 23, thereby improving heat dissipation efficiency.

The first lead frame 31 includes a first recess 33 which is concave, and the second lead frame 41 includes a second recess 43 which is concave in a direction opposite to the first recess 33. The first recess 33 may be concavely concaved in a direction from a gap between the first and second lead frames 31 and 41 to the first lead frame 31 or a first side surface S1 of the reflective member 71. The second recess 43 may be concavely concaved in a direction from the gap between the first and second lead frames 31 and 41 to the second lead frame 41 or a second side surface S2 of the reflective member 71. Here, the first side surface S1 and the second side surface S2 of the reflective member 71 may be opposite surfaces.

As in FIG. 4, the first and second recesses 33 and 43 may be disposed to correspond to each other and may be disposed in opposite directions. The first and second recesses 33 and 43 may be disposed in the same shape or different shapes. The first and second recesses 33 and 43 may have the same area or different areas. A bottom view shape of the first recess 33 may be a polygonal shape, an elliptical shape, or a hemispherical shape. A bottom view shape of the second recess 43 may be a polygonal shape, an elliptical shape, or a hemispherical shape.

As in FIG. 4, a depth D5 of the first recess 33 may be equal to or less than one-second of a width D4 of the first lead frame 31. For example, if the depth D5 of the first recess 33 is greater than one-half of the width D4 of the first lead frame 31, a heat dissipation efficiency of the first lead frame 31 is reduced, and a problem can occur in rigidity of a center. A depth D6 of the second recess 43 may be equal to or less than one-half of a width (for example, D4) of the second lead frame 41. For example, if the depth D6 of the second recess 43 is greater than one-half of the width (for example, D4) of the second lead frame 41, a heat dissipation efficiency of the second lead frame 41 is reduced, and a rigidity of a center is weakened.

The first recess 33 may overlap the first electrode 21 in a vertical direction, and the second recess 43 may overlap the second electrode 23 in a vertical direction. The protective chip 51 may be disposed in the second recess 43, and an end of the wire 53 connected to the protective chip 51 may be disposed in the first recess 33. As another example, the protective chip 51 may be disposed in the first recess 33, and the end of the wire 53 may be disposed in the second recess 43. However, the present embodiment is not limited thereto.

As in FIG. 4, a length D9 of the first recess 33 and the second recess 43 may be greater than that of the protective chip 51 and may be shorter than that of the first and second electrodes 21 and 23. The protective chip 51 and the wire 53 may be connected to the first and second electrodes 21 and 23 of the light emitting chip 11 and then may be accommodated into the first recess 33 and the second recess 43, and thus, the length of the first recess 33 and the second recess 43 may be set based on a process error in accommodating the protective chip 51 and the wire 53. A lengthwise direction of the first and second recesses 33 and 43 may be a direction vertical to a widthwise direction.

The first and second recesses 33 and 43 may be arranged on a center line C1 passing by a bottom center of the light emitting device 10, and at least one or all of ends of the protective chip 51 and the wire 53 may be disposed on the center line C1. The protective chip 51 may be disposed under a center of the light emitting chip 11, thereby uniformly providing a heat distribution occurring in the light emitting chip 11. The protective chip 51 and the wire 53 may be disposed between the first and second lead frames 31 and 41 under the light emitting chip 11, thereby preventing absorption of light emitted from the light emitting chip 11. Therefore, a light efficiency of the light emitting device 10 can be prevented from being reduced. Here, the center line C1 may be a region center between the first and second lead frames 31 and 41 and a straight line passing by centers of the first and second lead frames 31 and 41.

As in FIG. 2, an interval B1 between the first and second recesses 33 and 43 may be narrower than a distance between outermost sides of the first and second lead frames 31 and 41 and may be narrower than the width D1 of the light emitting chip 11. For example, if the interval B1 between the first and second recesses 33 and 43 is equal to or greater than the width D1 of the light emitting chip 11, heat dissipation efficiency can be reduced in center regions of the lead frames 31 and 41 disposed outside the first and second recesses 33 and 43.

At least one or all of heights of the first and second recesses 33 and 43 may be set to the same height as a thickness T1 of the first and second lead frames 31 and 41. Therefore, electrical interference between the wire 53 and the lead frames 31 and 41 can be prevented.

The thickness T1 of the first and second lead frames 31 and 41 may be a value which is greater than a value obtained by summating a thickness of the protective chip 51 and a low-point height of the wire 53, and may be set to 150 μm or more, for example, within a range of 180 μm to 350 μm. If the thickness T1 of the first and second lead frames 31 and 41 is less than the range, a low point of the wire 53 may be exposed to a portion under the first and second lead frames 31 and 41, and if the thickness T1 of the first and second lead frames 31 and 41 is thicker than the range, there is a problem where a thickness of the light emitting device 10 is thickened. If the thickness T1 of the first and second lead frames 31 and 41 is less than the range, a heat dissipation surface area is reduced, causing a problem where heat concentrates on a gap between the first and second lead frames 31 and 41.

A bottom surface of each of the first and second lead frames 31 and 41 may be disposed on the same horizontal plane as a bottom surface S4 of the reflective member 71. As another example, the bottom surface of each of the first and second lead frames 31 and 41 may protrude more downward than the bottom surface S4 of the reflective member 71, and such a protrusion structure enables improvement of an adhesive force with a bonding member such as a solder. Side surfaces of the first and second lead frames 31 and 41 may be exposed to both side surfaces S1 and S2 of the reflective member 71 or disposed on the same vertical surface as the side surfaces S1 and S2, or may protrude further than the side surfaces S1 and S2. In this case, a heat dissipation surface area of the lead frames 31 and 41 can increase.

The reflective number 71 may be disposed on an outer periphery of each of the light emitting chip 11 and the plurality of lead frames 31 and 41. An outer surface of the light emitting chip 11 may be spaced apart from the both side surfaces S1 and S2 or all side surfaces of the reflective number 71, thereby preventing penetration of moisture. Outer surfaces of the plurality of lead frames 31 and 41 may be may be spaced apart from the both side surfaces S1 and S2 or all side surfaces of the reflective number 71.

The reflective number 71 may be provided on a periphery from a bottom surface of each of the plurality of lead frames 31 and 41 to the top surface of the light emitting chip 11. If the light emitting device 10 includes the phosphor layer 61, the reflective number 71 may be disposed on an outer periphery of the top surface of the phosphor layer 61 from the bottom surface of each of the plurality of lead frames 31 and 41. Here, the top surface of the phosphor layer 61 may be disposed on the same horizontal surface as or higher than a top surface S3 of the reflective number 71, but is not limited thereto. The phosphor layer 61 may be removed or disposed to be separated from the reflective number 71, but is not limited thereto.

The reflective member 71 may be disposed in a gap region between the first and second lead frames 31 and 41 and in a region of each of the first and second recesses 33 and 43. The reflective member 71 may be disposed under the first and second electrodes 21 and 23 and in a region between the first and second electrodes 21 and 23.

The bottom surfaces of the first and second lead frames 31 and 41 may be exposed to the bottom surface S4 of the reflective member 71, and the exposed bottom surface regions of the first and second lead frames 31 and 41 may be bonded by a bonding member such as a solder.

The reflective number 71 is disposed on a periphery of each of the light emitting chip 11 and the phosphor layer 61 to reflect light incident from the light emitting chip 11 and the phosphor layer 61, thereby allowing light to be extracted through the phosphor layer 61.

The reflective number 71 may include a non-metal material or an insulating material, and for example, may be formed of a resin material such as silicon or epoxy. The reflective number 71 may include impurities having a refractive index which is higher than that of the resin material. At least one of compounds such as oxide, nitride, fluoride, and sulfide having at least one of Al, Cr, Si, Ti, Zn, and Zr may be added to the reflective number 71. The reflective number 71 may include, for example, at least one of $TiO_2$, $SiO_2$, and $Al_2O_3$.

As in FIGS. 2 and 3, a thickness T0 of the reflective member 71 may be equal to or thinner than a sum of thicknesses of the light emitting chip 11, the phosphor layer 61, and the lead frames 31 and 41. The thickness T0 of the reflective member 71 may be thicker than a sum of the thickness of the lead frames 31 and 41 and the thickness of the light emitting chip 11. A size of the light emitting device 10 may vary based on a size of the reflective member 71, and thus, a thickness of the light emitting device 10 may be provided as a thin thickness.

The reflective member 71 may be filled into a region between the first and second lead frames 31 and 41 and the inside of the first and second recesses 33 and 43. The reflective member 71 may be disposed on a periphery of each of the first and second lead frames 31 and 41. A portion of the reflective member 71 may be connected to a first region between the first and second electrodes 21 and 23 and a second region between the first and second lead frames 31 and 41.

As another example, a transmissive light guide layer (not shown) may be disposed in a region between the reflective number 71 and the light emitting chip 11, for light extraction. The light guide layer may be formed of a transparent resin material between the reflective number 71 and the light emitting chip 11 and may guide light, emitted in a direction toward a side surface of the light emitting chip 11, in an up direction. The reflective number 71 may contact the light guide layer without directly contacting the light emitting chip 11, thereby reflecting light, traveling to the light guide layer, in an up direction. The light guide layer may be disposed to extend between the phosphor layer 61 and the reflective number 71. The light guide layer may be disposed between the phosphor layer 61 and the reflective number 71, thereby improving an adhesive force between the phosphor layer 61 and the reflective number 71.

As in FIG. 4, bottom view shapes of the first and second recesses 33 and 43 may each be a polygonal shape and may be the same shape or different shapes. The first and second recesses 33 and 43 may have the same size. As another example, in the first and second recesses 33 and 43, a size of the recess 43 into which the protective chip 51 is accommodated may be larger, and a size of the recess 33 into which an end of the wire 53 is accommodated may be smaller.

Figure 5:
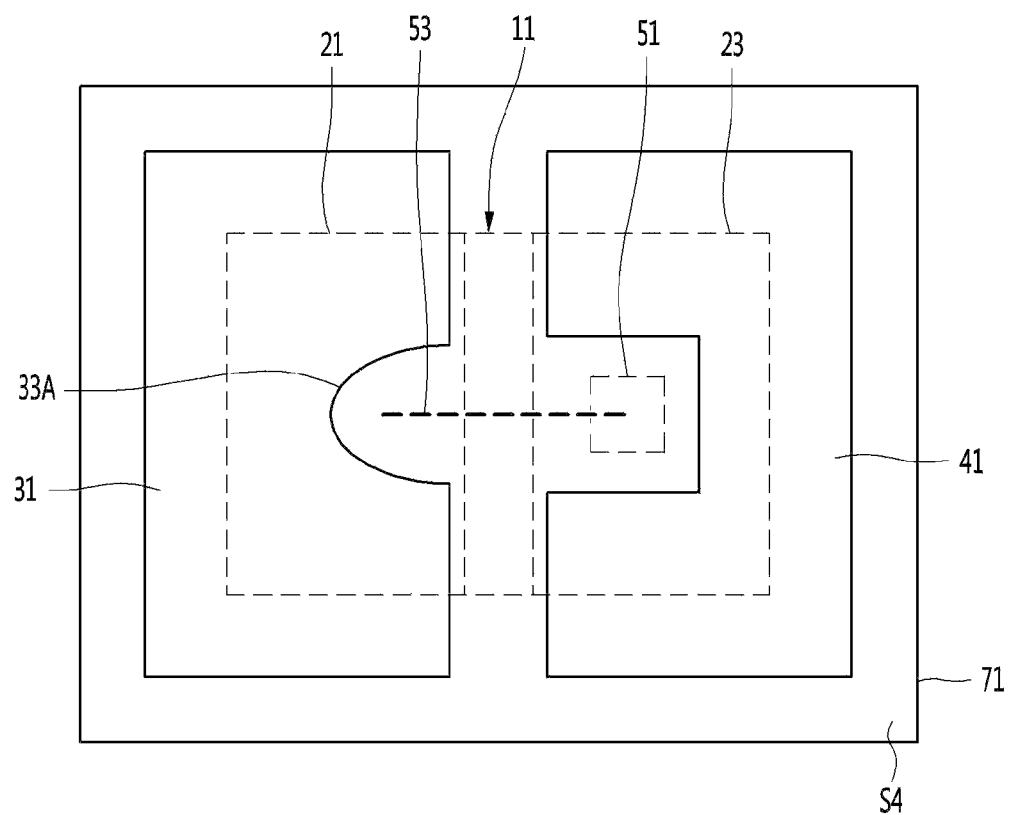
FIG. 5 is a bottom view illustrating another example of a cavity in the light emitting device of FIG. 4.

As in FIG. 5, in first and second recesses 33A and 43 of the first and second lead frames 31 and 41, an external shape of the recess 33A into which the end of the wire 53 is accommodated may be a hemispherical shape or a shape having a curved surface. An outer line of the recess 33A having a hemispherical shape may have the same interval as the end of the wire 53, thereby minimizing a size of the recess 33.

Figure 6:
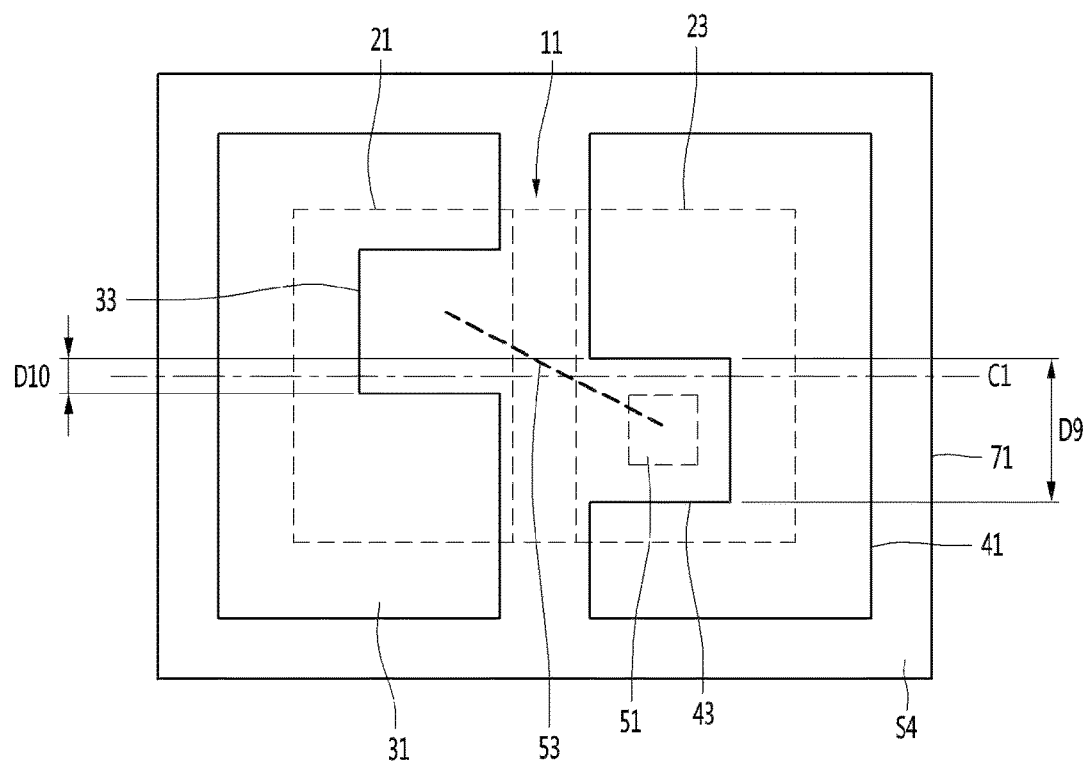
FIG. 6 is a bottom view illustrating another example of a cavity in the light emitting device of FIG. 4.

As in FIG. 6, at least one or all of the first and second recesses 33 and 43 may be cornerwise disposed in opposite directions with respect to the center line C1. The first and second recesses 33 and 43 may be tilted from the center line C1 and disposed, thereby dispersing a heat distribution. Also, a lead frame instead of a recess may be disposed in a lower center region of the light emitting chip 11, thereby improving a heat dissipation efficiency of a center. Here, the center line C1 may be a straight line which passes by a region center between the first and second lead frames 31 and 41 and a center of the first and second lead frames 31 and 41.

A portion of a region of the first recess 33 may overlap the second recess 43 in a horizontal direction, and a width D10 of the overlapped region may be equal to or less than one-half of a width D9 of the second recess 43. Due to the horizontal-direction overlapped region, a connection of the wire 53 can be easy.

A concave-convex structure may be disposed in at least one of a bottom surface and a side surface of each of the first and second lead frames 31 and 41, but is not limited thereto.

In an embodiment, the protective chip 51 and the wire 53 may be disposed in the recesses 33 and 43 between the first and second lead frames 31 and 41, thereby preventing an increase in thickness T1 of the first and second lead frames 31 and 41. Also, a thickness and a size of the light emitting device 10 can be reduced. Also, since the protective chip 51 is included in the light emitting device 10, the light emitting chip 11 can be electrically protected.

Figure 7:
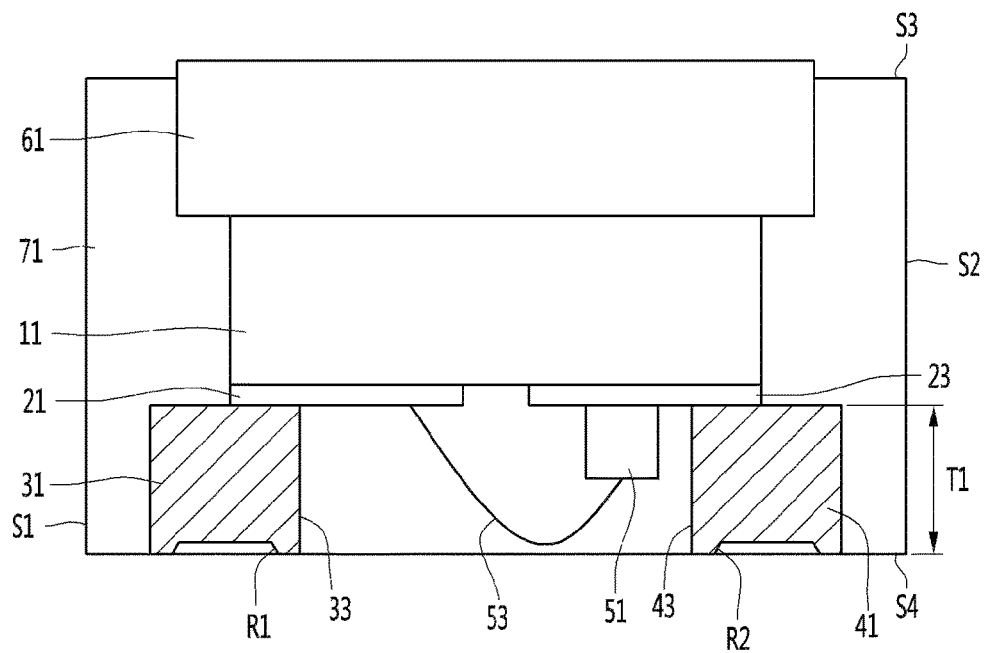
FIG. 7 is another example of the light emitting device of FIG. 2.

FIG. 7 is another example of the light emitting device of FIG. 2. In describing FIG. 7, the description is applied to the same elements as the embodiment.

Referring to FIG. 7, a light emitting device is implemented by modifying a bottom structure of each of first and second lead frames 31 and 41 disposed under a light emitting chip 11.

Bottom surfaces of the first and second lead frames 31 and 41 include concave portions R1 and R2, and the concave portions R1 and R2 are convexly concaved in a direction from the bottom surfaces of the first and second lead frames 31 and 41 to the light emitting chip 11. In the bottom surfaces of the first and second lead frames 31 and 41 including the concave portions R1 and R2, a contact area contacting the bonding members 133 and 143 can increase when bonding the first and second lead frames 31 and 41 to a circuit board 111 with bonding members 133 and 143 as in FIG. 14. Therefore, heat transfer efficiency based on the first and second lead frames 31 and 41 can be improved, and a bonding error can be prevented.

As another example, a transmissive light guide layer (not shown) may be disposed in a region between a reflective number 71 and the light emitting chip 11, for light extraction. The light guide layer may be formed of a transparent resin material between the reflective number 71 and the light emitting chip 11 and may guide light, emitted in a direction toward a side surface of the light emitting chip 11, in an up direction. The reflective number 71 may contact the light guide layer without directly contacting the light emitting chip 11, thereby reflecting light, traveling to the light guide layer, in an up direction. The light guide layer may be disposed to extend between the phosphor layer 61 and the reflective number 71. The light guide layer may be disposed between the phosphor layer 61 and the reflective number 71, thereby improving an adhesive force between the phosphor layer 61 and the reflective number 71.

Figure 8:
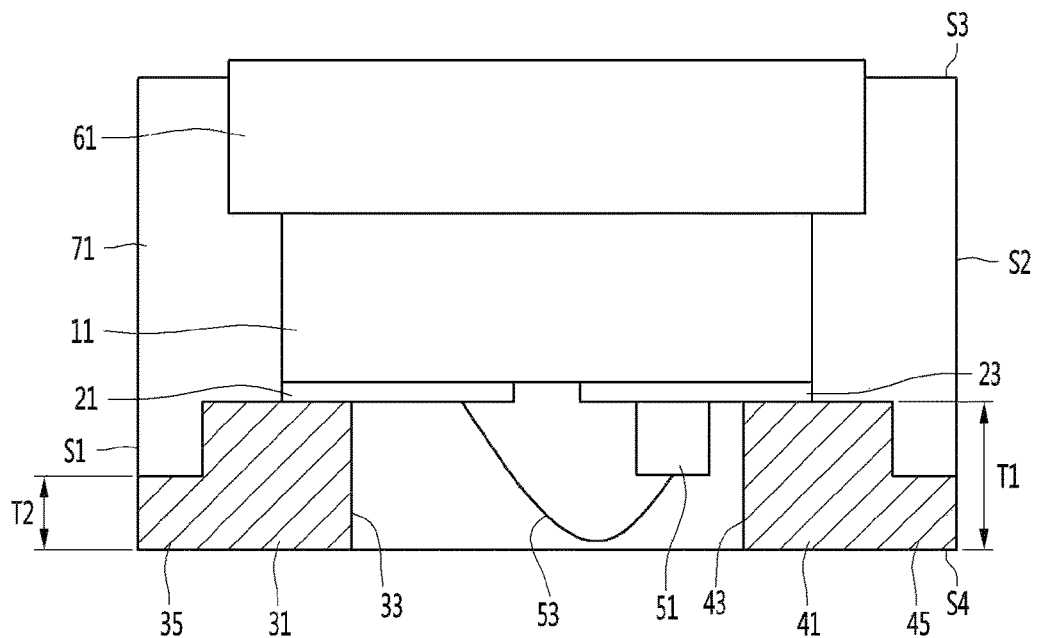
FIG. 8 is another example of the light emitting device of FIG. 2.
Figure 9:
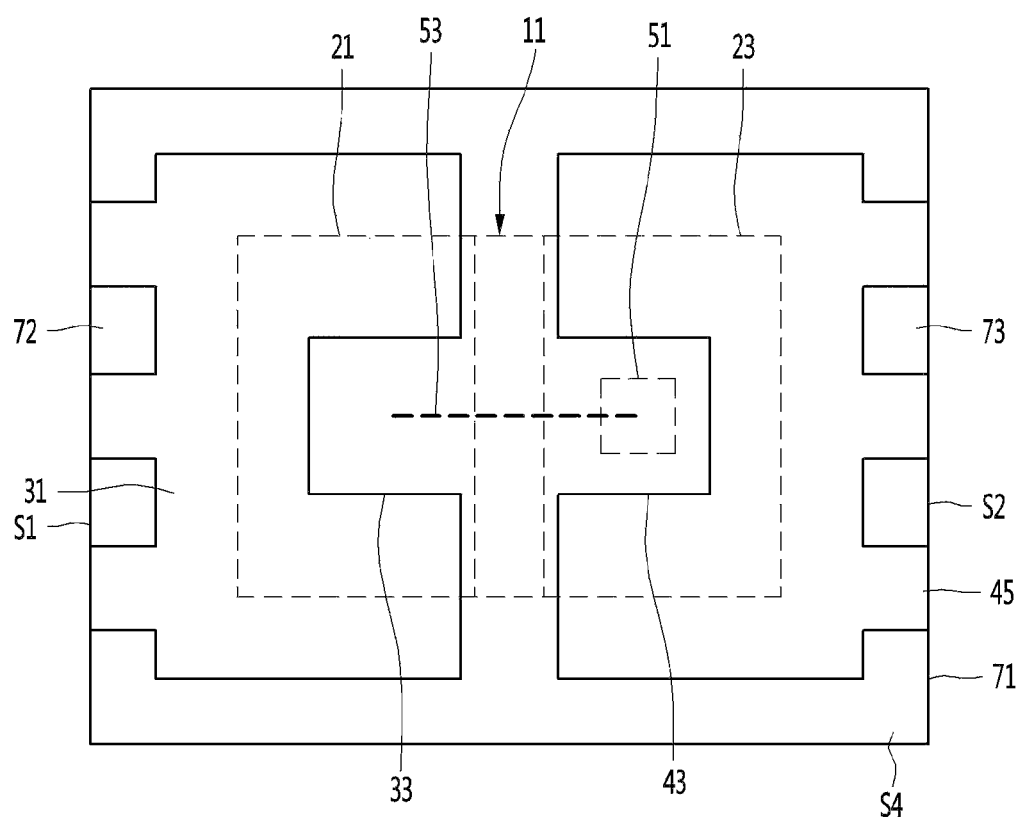
FIG. 9 is a bottom view of the light emitting device of FIG. 8.

FIG. 8 is another example of the light emitting device of FIG. 2, and FIG. 9 is a bottom view of the light emitting device of FIG. 8. In describing FIG. 8, the description is applied to the same elements as the embodiment.

Referring to FIG. 8, a light emitting device is implemented by modifying an external shape of each of first and second lead frames 31 and 41 disposed under a light emitting chip 11. The light emitting device includes a first protrusion 35, which protrudes from a first lead frame 31 to a first side surface S1 of a reflective member 71, and a second protrusion 45 which protrudes from a second lead frame 41 to a second side surface S2 of a reflective member 71. The first side surface S1 and the second side surface S2 of the reflective member 71 may be opposite side surfaces.

As in FIG. 9, the first protrusion 35 may be provided in plurality, and the plurality of first protrusions 35 may protrude from the first lead frame 31 to the first side surface S1 of the reflective member 71. A first lower portion 72 of the reflective member 71 may be disposed between the plurality of first protrusions 35. Therefore, the plurality of first protrusions 35 may be coupled to the first lower portion 72 of the reflective member 71, and thus, a coupling force between the first lead frame 31 and the reflective member 71 can be reinforced. The first lower portion 72 and the first protrusion 35 may be disposed on a bottom surface S4 of the reflective member 71.

The second protrusion 45 may be provided in plurality, and the plurality of first protrusions 45 may protrude from the second lead frame 41 to the second side surface S2 of the reflective member 71. A second lower portion 73 of the reflective member 71 may be disposed between the plurality of second protrusions 45. The second lower portion 73 and the second protrusion 45 may be disposed on the bottom surface S4 of the reflective member 71. Therefore, the plurality of second protrusions 45 may be coupled to the second lower portion 73 of the reflective member 71, and thus, a coupling force between the second lead frame 41 and the reflective member 71 can be reinforced.

Moreover, in the first and second lead frames 31 and 41, a contact area and a heat dissipation area based on the first and second protrusions 35 and 45 can increase.

A thickness T2 of the first and second protrusions 35 and 45 may be equal to or less than one-half of a thickness T1 of the first and second lead frames 31 and 41. For example, if the thickness T2 of the first and second protrusions 35 and 45 is greater than one-half of the thickness T1 of the first and second lead frames 31 and 41, a rigidity of the lower portions 72 and 73 of the reflective member 71 is weakened, and for this reason, a coupling force with the reflective member 71 cannot be improved.

Outer surfaces of the first and second protrusions 35 and 45 may be disposed on the same vertical surface as first and second side surfaces of the reflective member 71, or may protrude further than the first and second side surfaces of the reflective member 71. For example, if the first and second protrusions 35 and 45 protrude more outward than an outer surface of the reflective member 71, a heat dissipation area of each of the first and second lead frames 31 and 41 can increase.

As another example, a transmissive light guide layer (not shown) may be disposed in a region between a reflective number 71 and the light emitting chip 11, for light extraction. The light guide layer may be formed of a transparent resin material between the reflective number 71 and the light emitting chip 11 and may guide light, emitted in a direction toward a side surface of the light emitting chip 11, in an up direction. The reflective number 71 may contact the light guide layer without directly contacting the light emitting chip 11, thereby reflecting light, traveling to the light guide layer, in an up direction. The light guide layer may be disposed to extend between the phosphor layer 61 and the reflective number 71. The light guide layer may be disposed between the phosphor layer 61 and the reflective number 71, thereby improving an adhesive force between the phosphor layer 61 and the reflective number 71.

Figure 10:
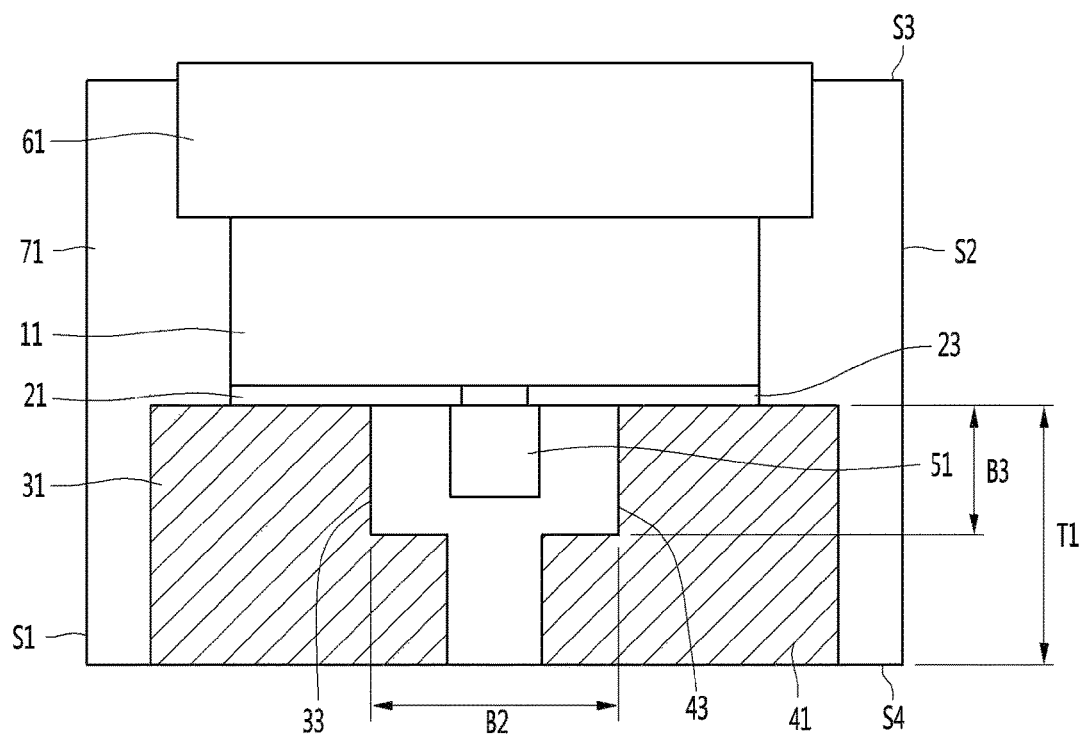
FIG. 10 is a side cross-sectional view illustrating a light emitting device according to a second embodiment.

FIG. 10 is a side cross-sectional view illustrating a light emitting device according to a second embodiment.

Referring to FIG. 10, the light emitting device includes a light emitting chip 11, a plurality of lead frames 31 and 41 disposed under different regions of the light emitting chip 11, a protective chip 51 connected to the light emitting chip 11 and disposed between the plurality of lead frames 31 and 41, and a reflective member 71 which covers a periphery of each of the light emitting chip 11 and the plurality of lead frames 31 and 41.

The first lead frame 31 includes a first recess 33, and the second lead frame 41 includes a second recess 43.

The first recess 33 may be provided in an upper portion of the first lead frame 31, and the second recess 43 may be provided in an upper portion of the second lead frame 41. The first and second recesses 33 and 43 may be disposed to face each other, and as in FIG. 6, may be disposed to be tilted, but are not limited thereto. Also, one or all of the first and second recesses 33 and 43 may have a hemispherical shape, but the present embodiment is not limited thereto.

The protective chip 51 may be disposed under the first and second electrodes 21 and 23 of the light emitting chip 11, and for example, may be flip-chip bonded to the first and second electrodes 21 and 23. An interval B2 between the first and second recesses 33 and 43 can be further narrowed than the structure of FIG. 2, and a heat dissipation area of each of the first and second lead frames 31 and 41 can increase. That is, a lower heat dissipation area of each of the first and second lead frames 31 and 41 can further increase.

A height B3 of each of the first and second recesses 33 and 43 is set less than a thickness T1 of the first and second lead frames 31 and 41, thereby minimizing a reduction in area of each of the first and second lead frames 31 and 41.

The protective chip 51 may be disposed in a gap region between upper portions of the first and second lead frames 31 and 41. Since a wire is not connected to the protective chip 51, lower portions of the first and second frames 31 and 41 may extend to a portion under a region of each of the first and second recesses 33 and 43. Therefore, an area of the bottom surface or a width of the bottom surface of each of the first and second lead frames 31 and 41 can increase in comparison with the structure of FIG. 2.

As another example, a transmissive light guide layer (not shown) may be disposed in a region between a reflective number 71 and the light emitting chip 11, for light extraction. The light guide layer may be formed of a transparent resin material between the reflective number 71 and the light emitting chip 11 and may guide light, emitted in a direction toward a side surface of the light emitting chip 11, in an up direction. The reflective number 71 may contact the light guide layer without directly contacting the light emitting chip 11, thereby reflecting light, traveling to the light guide layer, in an up direction. The light guide layer may be disposed to extend between the phosphor layer 61 and the reflective number 71. The light guide layer may be disposed between the phosphor layer 61 and the reflective number 71, thereby improving an adhesive force between the phosphor layer 61 and the reflective number 71.

Figure 11:
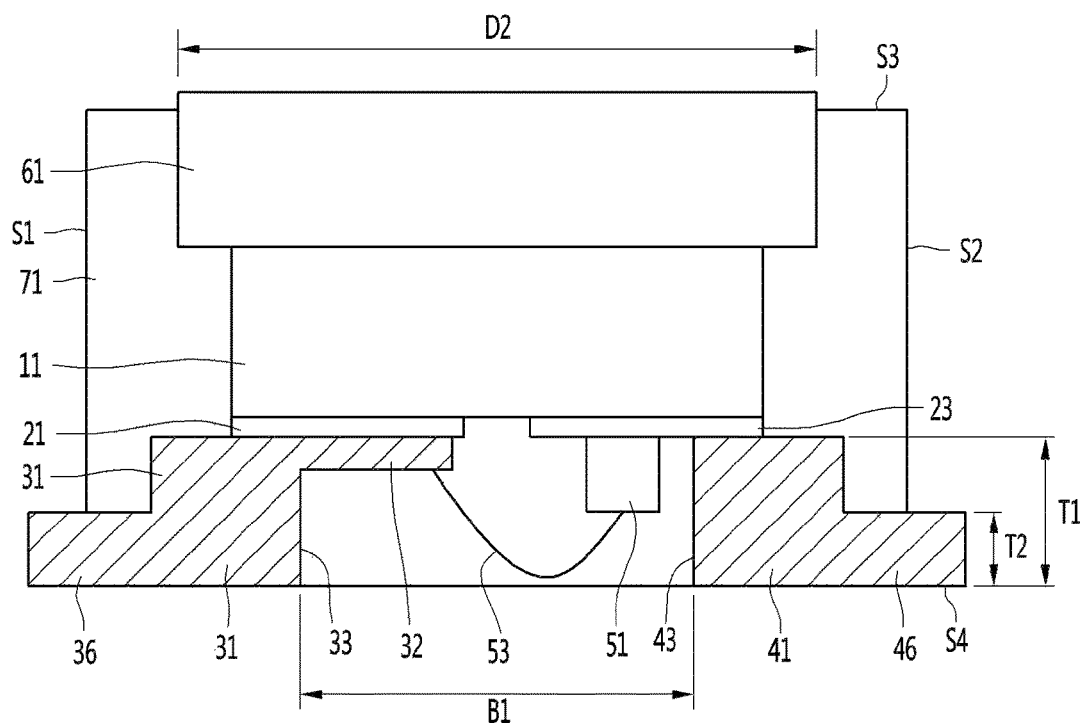
FIG. 11 is a side cross-sectional view illustrating a light emitting device according to a third embodiment.

FIG. 11 is a side cross-sectional view illustrating a light emitting device according to a third embodiment.

Referring to FIG. 11, the light emitting device includes a light emitting chip 11, a plurality of lead frames 31 and 41 disposed under different regions of the light emitting chip 11, a protective chip 51 connected to the light emitting chip 11 and disposed between the plurality of lead frames 31 and 41, and a reflective member 71 which covers a periphery of each of the light emitting chip 11 and the plurality of lead frames 31 and 41.

The first lead frame 31 is disposed under a first electrode 21 of the light emitting chip 11, and the second lead frame 41 is disposed under a second electrode 23 of the light emitting chip 11.

The first lead frame 31 includes a bonding part 32 which protrudes to a portion on a first recess 33. The bonding part 32 may be disposed between the first electrode 21 and an end of the wire 53. The bonding part 32 may extend to vertically overlap the first electrode 21 on the first recess 33.

The protective chip 51 may be disposed under the second electrode 23 of the light emitting chip 11 and may be connected to the bonding part 32 of the first lead frame 31 by the wire 53. A height difference between both ends of the wire 53 is reduced by the bonding part 32, and thus, a tension applied to the wire 53 can be reduced. Accordingly, a defect where the wire 53 connected to the protective chip 51 is disconnected or opened can be prevented.

The first lead frame 31 includes a first protrusion 36, and the first protrusion 36 may protrude more outward than a first side surface S1 of the reflective member 71. Heat dissipation efficiency can be improved in proportion to a protruding area of the first protrusion 36.

The second lead frame 41 includes a second protrusion 46, and the second protrusion 46 may protrude more outward than a second side surface S2 of the reflective member 71. Heat dissipation efficiency can be improved in proportion to a protruding area of the second protrusion 46.

Figure 12:
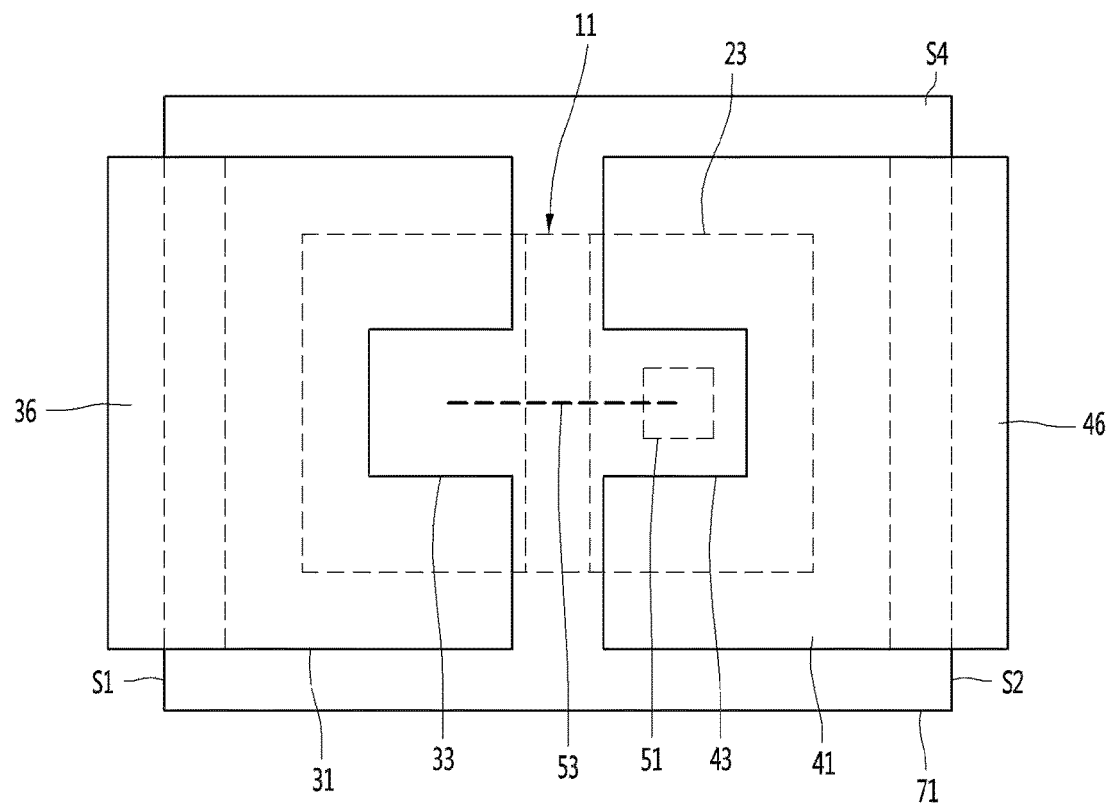
FIG. 12 is a bottom view of the light emitting device of FIG. 11.

As in FIG. 12, the first protrusion 36 may protrude by the same length as or a length different from that of the first lead frame 31. The second protrusion 46 may protrude by the same length as or a length different from that of the second lead frame 41.

Figure 13:
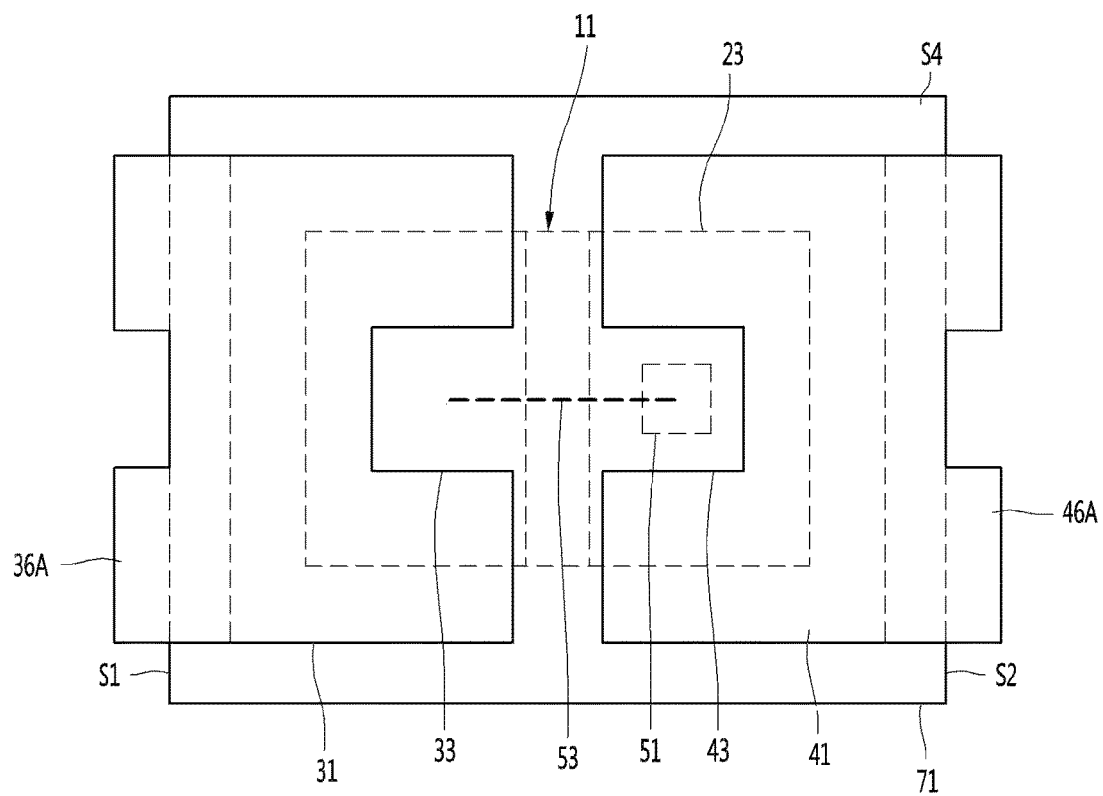
FIG. 13 is a bottom view illustrating another example of the light emitting device of FIG. 12.

As in FIG. 13, a first protrusion 36A may be provided in plurality, and the plurality of first protrusions 36A may protrude more outward than the first side surface S1 of the reflective member 71 from the first lead frame 31. A second protrusion 46A may be provided in plurality, and the plurality of second protrusions 46A may protrude more outward than the second side surface S2 of the reflective member 71 from the second lead frame 41. The first and second protrusions 36A and 46A can increase a contact area contacting a bonding member such as a solder, improve heat dissipation efficiency, and improve a coupling force with the reflective member 71.

As another example, a transmissive light guide layer (not shown) may be disposed in a region between a reflective number 71 and the light emitting chip 11, for light extraction. The light guide layer may be formed of a transparent resin material between the reflective number 71 and the light emitting chip 11 and may guide light, emitted in a direction toward a side surface of the light emitting chip 11, in an up direction. The reflective number 71 may contact the light guide layer without directly contacting the light emitting chip 11, thereby reflecting light, traveling to the light guide layer, in an up direction. The light guide layer may be disposed to extend between the phosphor layer 61 and the reflective number 71. The light guide layer may be disposed between the phosphor layer 61 and the reflective number 71, thereby improving an adhesive force between the phosphor layer 61 and the reflective number 71.

Figure 16A:
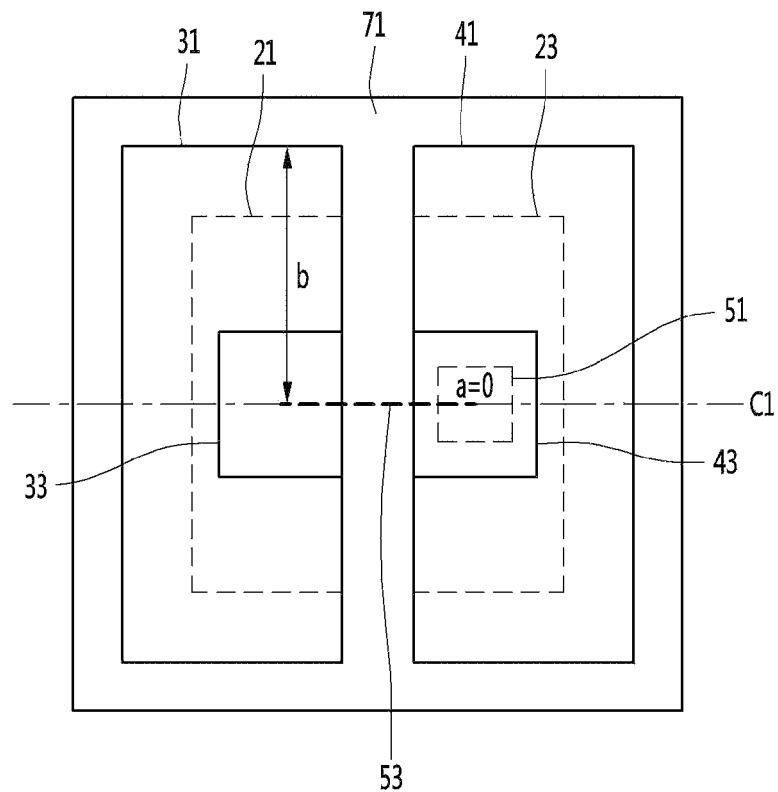
FIGS. 16A and 16B are diagrams illustrating a case, where a protective chip of a light emitting device according to an embodiment is located in a center region, and a heat distribution of a light emitting device.
Figure 16B:
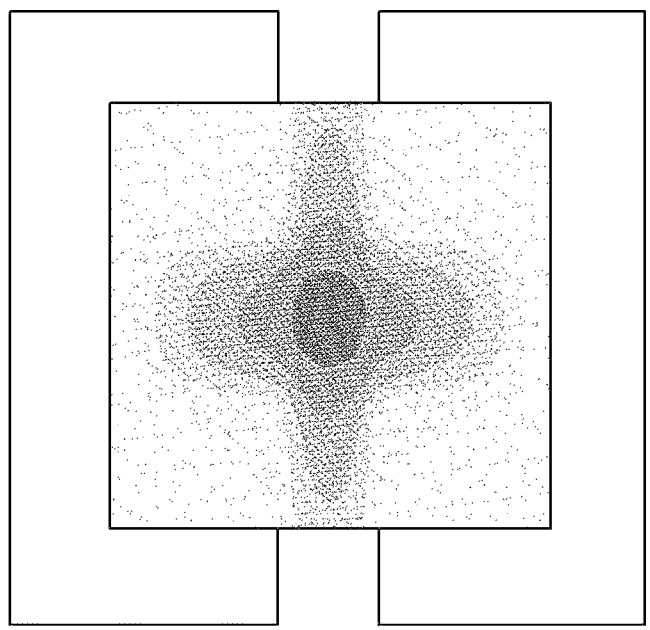
Figure 17A:
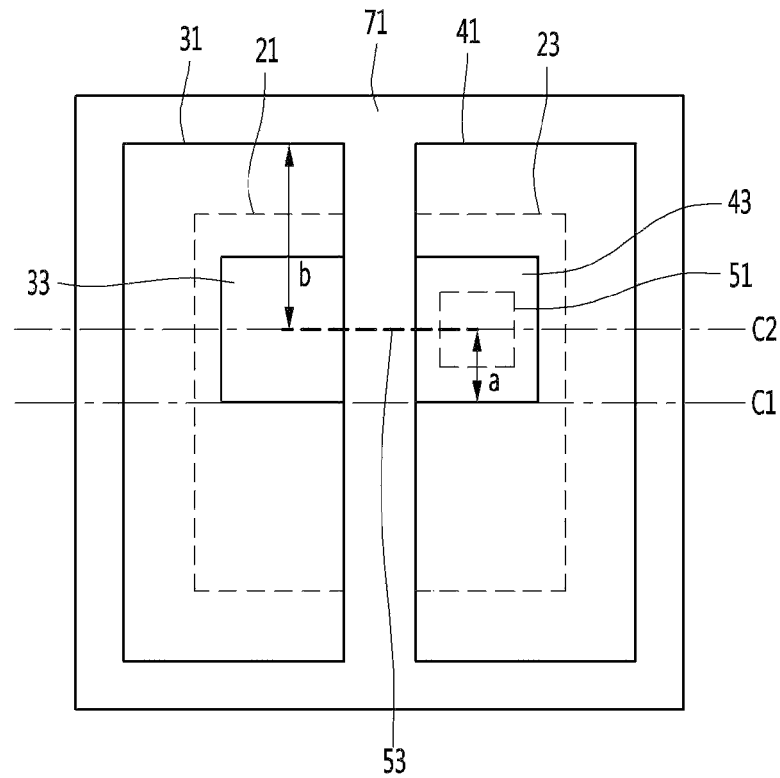
FIGS. 17A and 17B are diagrams illustrating a case, where a protective chip of a light emitting device according to an embodiment is located in a region adjacent to a center, and a heat distribution of the light emitting device.
Figure 17B:
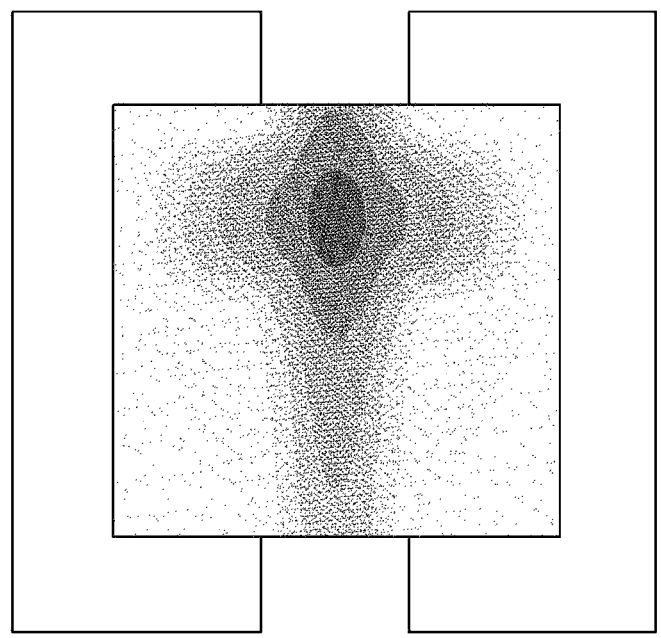
Figure 18A:
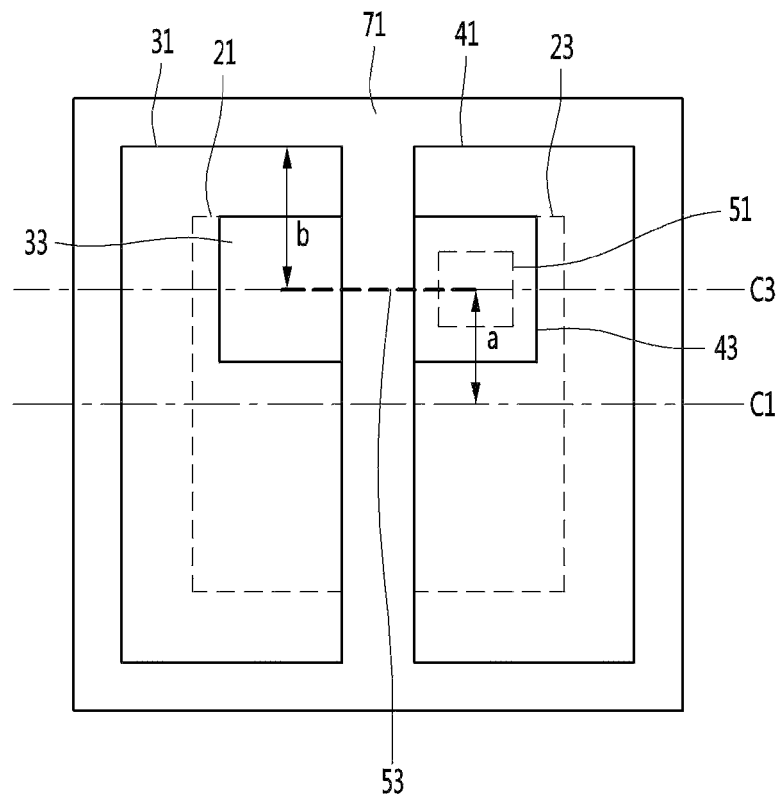
FIGS. 18A and 18B are diagrams illustrating a case, where a protective chip of a light emitting device according to an embodiment is located in an outer portion, and a heat distribution of the light emitting device.
Figure 18B:
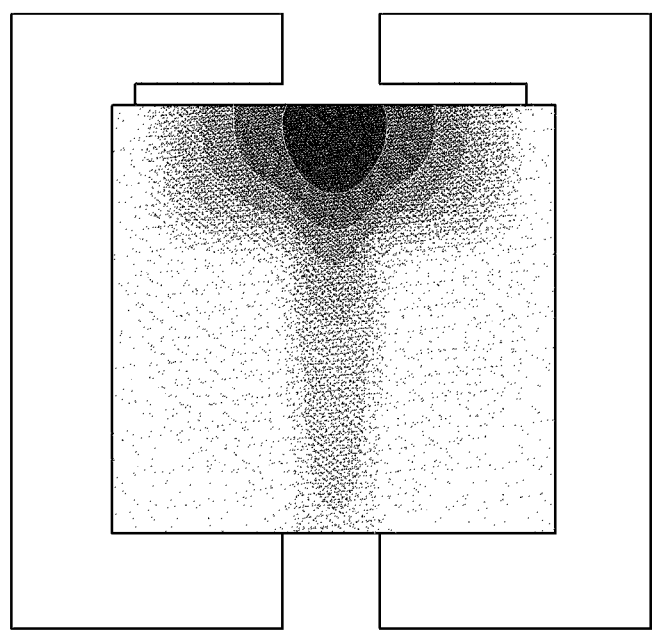

In the above-disclosed embodiments, a heat distribution of the light emitting device may vary based on positions of the first and second recesses 33 and 43. For example, as in FIG. 16A, in a case (a=0 and a/b=0) where the first and second recesses 33 and 43 are aligned on a lower center line C1 of the light emitting device, a heat distribution may be distributed on the right and the left with respect to a center as in FIG. 16B. For example, as in FIG. 7A or FIG. 18A, in a case (a>0 and a/b>0) where the first and second recesses 33 and 43 are aligned along lines C1 and C2 deviating from the lower center line C1 of the light emitting device, a heat distribution may be distributed in a region deviating from the center as in FIGS. 17B and 18B. Here, the "a" is a distance value to a center of the first and second recesses 33 and 43 or a center of the protective chip 51 with respect to the center line C1. The "b" is a straight distance from the center line C1 to the farthest side surface of side surfaces of the first and second lead frames 31 and 41. In FIG. 17A, a ratio of a/b is about 50%, and in FIG. 18A, a ratio of a/b is about 70%.

Figure 19:
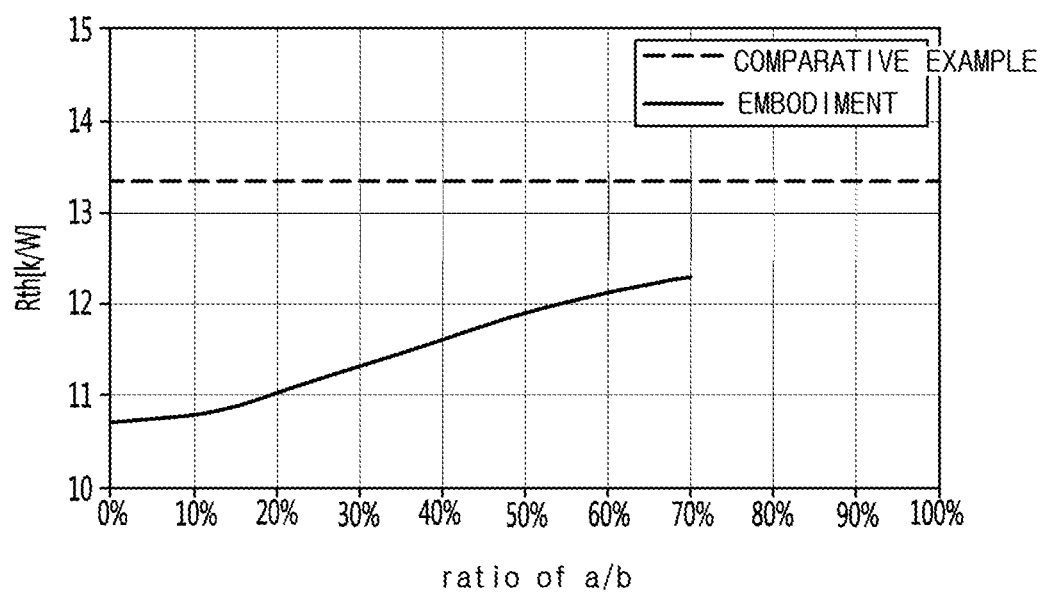
FIG. 19 is a graph illustrating a heat distribution with respect to a position of a protective chip of a light emitting device according to each of an embodiment and a comparative example.

As in FIG. 19, a comparative example is a case where a protective chip is disposed under a lead frame, and shows a certain heat distribution. In an embodiment, it can be seen that as a ratio of a/b increases incrementally, a thermal resistance (Rth) value increases incrementally, and in a case where a value of the "a" is 0, it can be seen that a thermal resistance is the lowest. Also, it can be seen that as first and second recesses and the protective chip become farther away from a center line C1 as in FIGS. 16A to 18A, the thermal resistance value increases. Therefore, in a case where a ratio of a/b is 0, it can be seen that a thermal resistance is the lowest. Here, a direction in which the protective chip becomes farther away from a certain position may be a direction which is more adjacent to an outer region between the first and second lead frames than a center region between the first and second lead frames.

Figure 14:
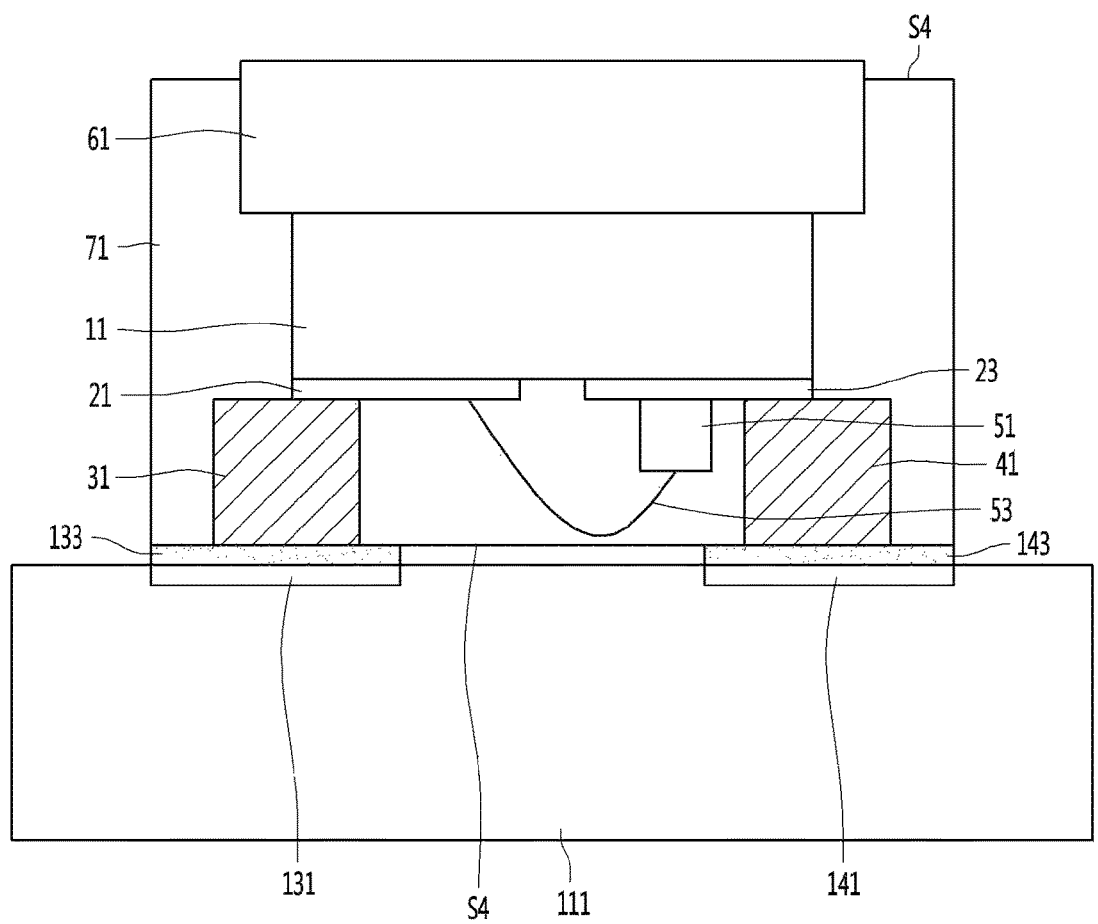
FIG. 14 is a side cross-sectional view of a light emitting module including a light emitting device according to an embodiment.

FIG. 14 is a side cross-sectional view of a light emitting module including a light emitting device according to an embodiment.

Referring to FIG. 14, the light emitting module includes a light emitting device 10, a circuit board 111 under the light emitting device 10, and first and second bonding members 133 and 134 between the circuit board 111 and the light emitting device 10.

The light emitting device 10 may include a light emitting device disclosed in an embodiment, and for example, may include a light emitting device disclosed in the first to third embodiments.

In the light emitting device 10, first and second lead frames 31 and 41 disposed in a lower portion may be disposed in correspondence with first and second electrode pads 131 and 141 of the circuit board 111. The circuit board 111 may include a circuit pattern including the first and second electrode pads 131 and 141.

The first bonding member 133 is disposed between the first lead frame 31 and the first electrode pad 131 of the circuit board 111 to electrically connect the first lead frame 31 to the first electrode pad 131.

The second bonding member 143 is disposed between the second lead frame 41 and the second electrode pad 141 of the circuit board 111 to electrically connect the second lead frame 41 to the second electrode pad 141.

The first and second bonding members 133 and 143 may include a solder paste material. The solder paste material includes at least one of gold (Au), tin (Sn), plumbum (Pb), copper (Cu), bismuth (Bi), indium (In), and silver (Ag). The first and second bonding members 133 and 143 directly conduct heat to the circuit board 111, and thus, thermal conduction efficiency can be improved.

As another example, the first and second bonding members 133 and 143 may include a conductive film, and the conductive film includes one or more conductive particles in an insulating film. The conductive particles may include, for example, metal or at least one of a metal alloy and carbon. The conductive particles may include at least one of nickel, silver, gold, aluminum, chromium, copper, and carbon. The conductive film may include an anisotropic conductive film or an anisotropic conductive adhesive.

An adhesive member (for example, a thermal conductive film) may be provided between the light emitting device 10 and the circuit board 111. The thermal conductive film may use polyester resins such as polyethylene terephthalate, polybutylene terephthalate-laid, and polyethylene terephthalate; polyimide resin; acrylic resin; styrene-based resin such as polystyrene and acrylonitrile-styrene; polycarbonate resin; poly-lactic acid resin; polyurethane resin, etc. Also, the thermal conductive film may include polyolefin resins such as polyethylene, polypropylene, and ethylene-propylene copolymer; vinyl resins such as polyvinyl chloride and polyvinylidene chloride; polyamide resin; sulfone-based resin; polyether-ether ketone-based resin; allylate-based resin; or at least one of blends of the resins.

The circuit board 111 may include at least one of a printed circuit board (PCB) including a resin material, a metal core PCB (MCPCB), a flexible PCB (FPCB), but is not limited thereto.

The light emitting device 10 may be provided in plurality, and the plurality of light emitting devices 10 may be disposed in at least one row, but is not limited thereto.

Figure 15:
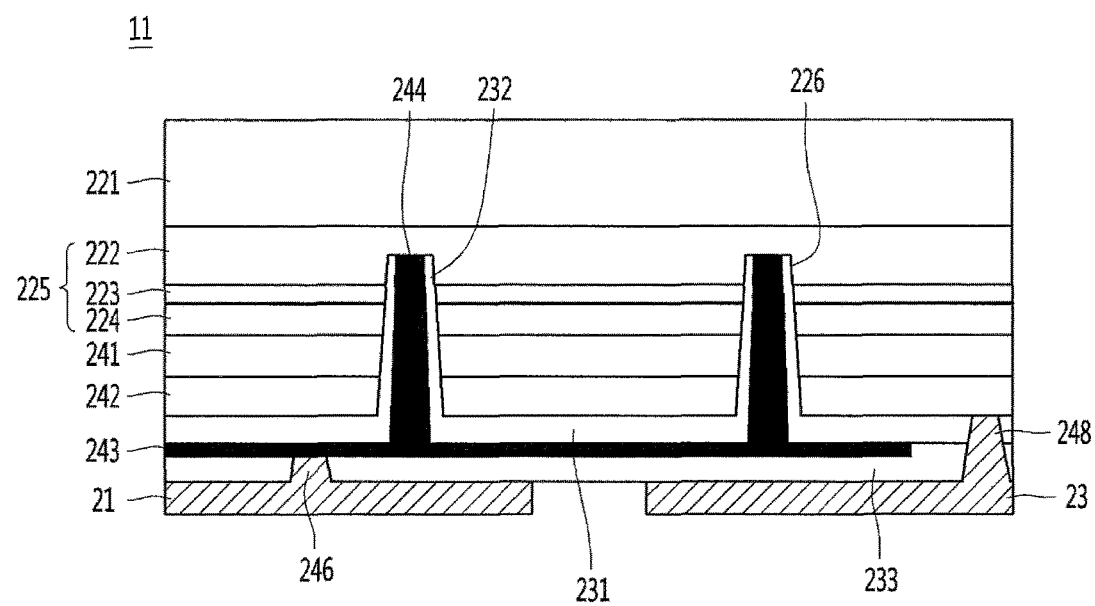
FIG. 15 is a diagram illustrating a light emitting chip of a light emitting device according to an embodiment.

FIG. 15 is a view illustrating example of a light emitting chip according to an embodiment.

Referring to FIG. 15, the light emitting chip 11 includes a light emitting structure 225 and a plurality of electrodes 21 and 23. The light emitting structure 225 may be provided as the group II to VI compound semiconductor layer, the group III-V compound semiconductor layer, or the group II-VI compound semiconductor layer. The plurality of electrodes 21 and 23 may be selectively connected to the semiconductor layer of the light emitting structure 225 to supply power. The light emitting structure 225 may include a first conductive type semiconductor layer 222, an active layer 223, and a second conductive type semiconductor layer 224.

The light emitting chip may include a substrate 221. The substrate 221 may be disposed on the light emitting structure 225. The substrate 221 may be, for example, a light transmissive or insulation substrate or a conductive substrate. For example, the substrate 221 may be use at least one of sapphire (Al2O3), SiC, Si, GaAs, GaN, ZnO, Si, GaP, InP, Ge, and Ga2O3. A plurality of convex portions (not shown)

may be disposed on at least one or all of top surface and bottom surfaces of the substrate 221 to improve light extraction efficiency. Each of the convex portions may include a hemispheric shape, a semi-elliptical surface, or a polygonal shape in a lateral cross-section. Here, the substrate 221 may be removed from the inside of the light emitting chip, but is not limited thereto.

The light emitting chip 11 may include at least one of a buffer layer (not shown) and an undoped semiconductor layer (not shown) between the substrate 221 and the light emitting structure 225. The buffer layer may be a layer for reducing a lattice constant difference between the substrate 221 and the semiconductor layer and may be made of a material selected from the group II to VI compound semiconductors. An undoped group III-V compound semiconductor layer may be further disposed under the buffer layer 112, but is not limited thereto. The substrate 221 may be removed. When the substrate is removed, the phosphor layer 61 may come into contact with a top surface of the first conductive type semiconductor layer 222 or a top surface of the other semiconductor layer.

The light emitting structure 225 may be disposed under the substrate 221 and includes a first conductive type semiconductor layer 222, an active layer 223 and a second conductive type semiconductor layer 224. The other semiconductor layer may be further disposed on at least one of top and bottom surfaces of each of the layers 222, 223 and 224, but is not limited thereto.

The first conductive type semiconductor layer 222 may be disposed under the substrate 221 and realized as a semiconductor into which a first conductive type dopant is doped, e.g., an n-type semiconductor layer. The first conductive type semiconductor layer 222 may include a semiconductor material having a compositional formula of InxAlyGa1-x-yN (0≤x≤1, 0≤y≤1, 0≤x+y≤1). The first conductive type semiconductor layer 222 may be made of a material selected from the group III-V compound semiconductors, e.g., GaN, AlN, AlGaN, InGaN, InN, InAlGaN, AlInN, AlGaAs, GaP, GaAs, GaAsP, and AlGaInP. The first conductive type dopant may be an n-type dopant and include a dopant such as Si, Ge, Sn, Se, and Te.

The active layer 223 may be disposed under the first conductive type semiconductor layer 222 and have one of a single quantum well structure, a multi quantum well (MQW) structure, a quantum wire structure, and a quantum dot structure and also have a cycle of a wall layer and a barrier layer. The cycle of the wall layer/barrier layer includes, for example, at least one of pairs of InGaN/GaN, GaN/AlGaN, AlGaN/AlGaN, InGaN/AlGaN, InGaN/InGaN, AlGaAs/GaA, InGaAs/GaAs, InGaP/GaP, AlInGaP/InGaP, and InP/GaAs.

The second conductive type semiconductor layer 224 is disposed under the active layer 223. The second conductive type semiconductor layer 224 may include a semiconductor, into which a second conductive type dopant is doped, having a compositional formula of InxAlyGa1-x-yN (0≤x≤1, 0≤y≤1, 0≤x+y≤1). For example, the second conductive type semiconductor layer 224 may be made of at least one of compound semiconductors such as GaN, InN, AlN, InGaN, AlGaN, InAlGaN, AlInN, AlGaAs, GaP, GaAs, GaAsP, and AlGaInP. The second conductive type semiconductor layer 224 may be a p-type semiconductor layer, and the first conductive type dopant may include Mg, Zn, Ca, Sr, or Ba as a p-type dopant.

For another example of the light emitting structure 225, the first conductive type semiconductor layer 222 may be realized as a p-type semiconductor layer, and the second conductive type semiconductor layer 224 may be realized as an n-type semiconductor layer. Also, a third conductive type semiconductor layer having a polarity opposite to that of the second conductive type semiconductor layer may be disposed under the second conductive type semiconductor layer 224. Also, the light emitting structure 225 may have one structure of an n-p junction structure, a p-n junction structure, an n-p-n junction structure and a p-n-p junction structure.

Pads 21 and 23 may be disposed on a lower portion of the light emitting chip 11. The first electrode 21 is electrically connected to the first conductive type semiconductor layer 222, and the second electrode 23 is electrically connected to the second conductive type semiconductor layer 224. Each of the first and second electrodes 21 and 23 may have a bottom shape having a polygonal or circular shape.

The light emitting chip 11 includes first and second electrode layers 241 and 242, a third electrode layer 243, and insulation layers 231 and 233. Each of the first and second electrode layers 241 and 242 may have a single or multi-layered structure and function as a current spreading layer. The first and second electrode layers 241 and 242 may include a first electrode layer 241 disposed under the light emitting structure 225 and a second electrode layer 242 disposed under the first electrode layer 241. The first electrode layer 241 may spread current, and the second electrode layer 242 may reflect incident light.

The first and second electrode layers 241 and 242 may be made of materials different from each other. The first electrode layer 241 may be made of a light transmissive material, for example, metal oxide or metal nitride.

The first electrode layer 241 may be made of a material selected from indium tin oxide (ITO), ITO nitride (ITON), indium zinc oxide (IZO), IZO nitride (IZON), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), and gallium zinc oxide (GZO).

The second electrode layer 242 may come into contact with a bottom surface of the first electrode layer 241 and function as a reflective electrode layer. The second electrode layer 242 may be made of a metal, for example, Ag, Au, or Al. When a portion of a region of the first electrode layer 241 is removed, the second electrode layer 242 may come into partial contact with the bottom surface of the light emitting structure 225.

For another example, the first and second electrode layers 241 and 242 may be laminated with an Omni directional reflector layer (ODR) structure. The ODR structure may be a structure in which the first electrode layer 241 having a low refractive index and the second electrode layer 242 coming into contact with the first electrode layer 241 and made of a metal material having high reflectivity are laminated. The electrode layers 241 and 242 may have, for example, a laminated structure of ITO/Ag. A total orientation reflective angle may be improved at an interface between the first electrode layer 241 and the second electrode layer 242.

For another example, the second electrode layer 242 may be removed or provided as a reflective layer made of different material. The reflective layer may have a distributed Bragg reflector (DBR) structure. The DBR structure may include a structure in which two dielectric layers having different refractive indexes are alternately disposed, for example, may include one of a SiO2 layer, a Si3N4 layer, a TiO2 layer, an Al2O3 layer, and an MgO layer. For another example, the electrode layers 241 and 242 may include all of the DBR structure and the ODR structure. In this case, the light emitting chip having light reflectivity of 98% or more may be provided. Since the light emitting chip mounted in the flip manner emits light reflected from the second electrode layer 242 through the substrate 221, most of light may be released in a vertical upward direction.

Also, light emitted from a lateral surface of the light emitting chip may be reflected toward a light output region by the reflective member according to the embodiments.

The third electrode layer 243 may be disposed under the second electrode layer 242 and electrically insulated from the first and second electrode layers 241 and 242. The third electrode layer 243 may be made of a metal, for example, at least one of Ti, Cu, Ni, Au, Cr, Ta, Pt, Sn, Ag, and P. The first electrode 21 and the second electrode 23 are disposed under the third electrode layer 243.

The insulation layers 231 and 233 may prevent unnecessary contact between the layers of the first and second electrode layers 241 and 242, the third electrode layer 243, the first and second electrodes 21 and 23, and the light emitting structure 225 from occurring. The insulation layers 231 and 233 include first and second insulation layers 231 and 233. The first insulation layer 231 is disposed between the third electrode layer 243 and the second electrode layer 242. The second insulation layer 233 is disposed between the third electrode layer 243 and the first/second electrodes 21 and 23.

The third electrode layer 243 is connected to the first conductive type semiconductor layer 222. The connection part 244 of the third electrode layer 243 protrudes from a via structure through the first and second electrode layers 241 and 242 and the light emitting structure 225 to come into contact with the first conductive type semiconductor layer 222. The connection part 244 may be provided in plurality. A portion 232 of the first insulation layer 231 extends to the surrounding of the connection part 224 of the third electrode layer 243 to prevent the third insulation layer 243, the first and second electrode layers 241 and 242, the second conductive type semiconductor layer 224, and the active layer 223 from being electrically connected to each other. An insulation layer may be disposed on a side surface of the light emitting structure 225 to protect the side surface, but is not limited thereto.

The second electrode 23 is disposed under the second insulation layer 233 and comes into contact with or is connected to at least one of the first and second electrode layers 241 and 242 through an opened region of the second insulation layer 233. The first electrode 21 is disposed under the second insulation layer 233 and connected to the third electrode layer 243 through the opened region of the second insulation layer 233. Thus, a protrusion 248 of the first electrode 23 is electrically connected to the second conductive type semiconductor layer 224 through the first and second electrode layers 241 and 242, and a protrusion 246 of the second electrode 21 is electrically connected to the first conductive type semiconductor layer 222 through the third electrode layer 243.

Such a light emitting device or a light emitting module may be applied to a display device such as a portable terminal, a monitor of a notebook computer, a monitor of a laptop computer, a TV, or applied to a vehicle lamp, a three-dimensional display, various illumination lamps, a traffic lamp, a vehicle headlight, or a display board.

Features, structures, and effects described in the above embodiments are incorporated into at least one embodiment, but are not limited to only one embodiment. Moreover, features, structures, and effects exemplified in one embodiment can easily be combined and modified for another embodiment by those skilled in the art. Therefore, these combinations and modifications should be construed as falling within the scope of the present invention.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

Embodiments can improve a heat dissipation efficiency of a light emitting device including a light emitting chip.

Embodiments can improve a heat dissipation efficiency of a light emitting device including a light emitting chip and a protective chip.

Embodiments can improve the reliability of a light emitting device where a light emitting chip and a protective chip are packaged.

In embodiments, a reflective number is disposed on a periphery of a light emitting chip, thereby improving light extraction efficiency.

A light emitting device according to embodiments may be applied to lighting devices such as lighting lamps, indicating lamps, vehicle lamps, and backlight units.

The invention claimed is:

1. A light emitting device comprising:
    a light emitting chip including a plurality of semiconductor layers and first and second electrodes under the plurality of semiconductor layers;
    a first lead frame disposed under the first electrode of the light emitting chip;
    a second lead frame disposed under the second electrode of the light emitting chip;
    a protective chip disposed between the first and second lead frames and electrically connected to the first and second electrodes; and
    a reflective member disposed on a periphery of the light emitting chip and the first and second lead frames,
    wherein the first lead frame includes a first recess concaved in a first lateral direction of the reflective member,
    wherein the second lead frame includes a second recess concaved in a second lateral direction of the reflective member, and
    wherein at least one of the first and second recesses has the same height as a thickness of the first lead frame.

2. The light emitting device of claim 1, wherein the first lead frame comprises at least one first protrusion protruding in a direction toward a first side surface of the reflective member, and
    the second lead frame comprises at least one second protrusion protruding in a direction toward a second side surface of the reflective member.

3. The light emitting device of claim 2, wherein the first protrusion has a thickness thinner than a thickness of the first lead frame and protrudes more outward than a first side surface of the reflective member, and the second protrusion has a thickness thinner than the thickness of the first lead frame and protrudes more outward than a second side surface of the reflective member.

4. The light emitting device of claim 2, wherein the first lead frame comprises a plurality of first protrusions spaced apart from each other, and the second lead frame comprises a plurality of second protrusions spaced apart from each other.

5. The light emitting device of claim 4, wherein a lower portion of the reflective member protrudes to a region between the plurality of first protrusions and second protrusions.

6. The light emitting device of claim 5, comprising a phosphor layer on the light emitting chip,
wherein the reflective member is disposed on a periphery of the phosphor layer.

7. The light emitting device of claim 6, wherein a top surface of the reflective member is disposed lower than a top surface of the phosphor layer and higher than a top surface of the light emitting chip, and
the light emitting device comprises a light guide layer including a transparent resin material between the reflective member and the light emitting chip.

8. The light emitting device of claim 1, wherein the first recess is concaved in a direction from a gap between the first and second lead frames to the first side surface of the reflective member,
wherein the second recess is concaved in a direction from the gap between the first and second lead frames to the second side surface of the reflective member, and
wherein the protective chip is disposed in one of the first and second recesses.

9. The light emitting device of claim 8, wherein the protective chip is disposed in the second recess and is connected to the first electrode, disposed in the first recess, by a wire, and
a straight line passing by centers of the first and second recesses passes by a gap center between the first and second lead frames.

10. The light emitting device of claim 9, wherein the first recess has the same height as the thickness of the first lead frame, and
wherein the second recess has the same height as a thickness of the second lead frame.

11. The light emitting device of claim 9, wherein the first lead frame comprises a bonding part disposed between an end of the wire and the first electrode.

12. The light emitting device of claim 9, wherein the first recess has a polygonal shape or a hemispherical shape.

13. The light emitting device of claim 1, further comprising a reflective member disposed on a periphery of the light emitting chip and the first and second lead frames,
wherein an interval between the first and second lead frames is provided wider than an interval between the first and second electrodes,
a thickness of the first and second lead frames is provided thicker than a thickness of the protective chip, and
the reflective member comprises a resin material and is disposed in a region between the first and second lead frames and a region between the first and second electrodes.

14. The light emitting device of claim 13, wherein
the protective chip is disposed in one of the first and second recesses, and
the first and second recesses are disposed in opposite directions with respect to region between the first and second lead frames.

15. The light emitting device of claim 14, wherein a straight line passing by centers of the first and second recesses passes by a gap center between the first and second lead frames.

16. The light emitting device of claim 15, wherein the first and second recesses have the same height as a thickness of the first lead frame,
an end of a wire connected to the protective chip is disposed in one of the first and second recesses, and
an outer region of each of the first and second lead frames is disposed more outward than a side surface of the light emitting chip.

17. The light emitting device of claim 13, comprising a phosphor layer on the light emitting chip,
wherein the reflective member is disposed on a periphery of the phosphor layer, and
the reflective member has a thickness thicker than a sum of a thickness of the light emitting chip and a thickness of the lead frame.

18. The light emitting device of claim 1, wherein the protective chip is connected to a portion under each of the first and second electrodes in a flip chip type.

19. The light emitting device of claim 1, wherein the reflective member comprises a resin material.

20. A light emitting module comprising:
the light emitting device of claim 1;
a circuit board including first and second electrode pads under the light emitting device; and
a bonding member disposed between the circuit board and the light emitting device,
wherein the first and second lead frames of the light emitting device are connected to the first and second electrode pads of the circuit board by the bonding member.

* * * * *